United States Patent
Okura

(10) Patent No.: US 11,070,761 B2
(45) Date of Patent: Jul. 20, 2021

(54) SOLID-STATE IMAGING DEVICE, METHOD FOR DRIVING SOLID-STATE IMAGING DEVICE, AND ELECTRONIC APPARATUS HAVING AN AMPLIFIER WITH AN INVERTING INPUT TERMINAL HAVING AT LEAST A FIRST INVERTING INPUT CHANNEL AND A SECOND INVERTING INPUT CHANNEL

(71) Applicant: BRILLNICS SINGAPORE PTE. LTD., Singapore (SG)

(72) Inventor: Shunsuke Okura, Tokyo (JP)

(73) Assignee: BRILLNICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/743,770

(22) Filed: Jan. 15, 2020

(65) Prior Publication Data
US 2020/0236318 A1    Jul. 23, 2020

(30) Foreign Application Priority Data

Jan. 17, 2019 (JP) .............................. JP2019-006163

(51) Int. Cl.
H04N 5/378      (2011.01)
H04N 5/355      (2011.01)
H04N 5/363      (2011.01)

(52) U.S. Cl.
CPC ............. *H04N 5/378* (2013.01); *H04N 5/355* (2013.01); *H04N 5/363* (2013.01)

(58) Field of Classification Search
CPC ......... H04N 5/378; H04N 5/355; H04N 5/363
See application file for complete search history.

(56) References Cited

U.S. PATENT DOCUMENTS 9,386,240 B1      7/2016  Johansson et al.
2011/0148523 A1   6/2011  Deng et al.
(Continued)

FOREIGN PATENT DOCUMENTS

JP    3984814 B2     10/2007
JP    2019054303 A   4/2019

OTHER PUBLICATIONS

European Patent Office, Extended European Search Report issued in EP Patent Application No. 20152113.5, dated Apr. 14, 2020, pp. 1-9.

*Primary Examiner* — Nicholas G Giles
(74) *Attorney, Agent, or Firm* — Pillsbury Winthrop Shaw Pittman LLP

(57) ABSTRACT

One object is to provide a solid-state imaging device, a method for driving a solid-state imaging device, and an electronic apparatus capable of removing a noise gap at a connection point between the low conversion gain data and the high conversion gain data, suppressing increase of power consumption and circuit areas, providing a wide dynamic range, and thus achieving high image quality. An amplifying part for amplifying a plurality of pixel signals read out from a pixel includes an amplifier. The amplifier includes an inverting input terminal and a non-inverting input terminal. The inverting input terminal includes a first inverting input channel and a second inverting input channel. The first inverting input channel is connected to a second node, and the second inverting input channel is connected to a third node. A capacitance of a second sampling capacitor is 8C, and a capacitance of a first sampling capacitor is C.

20 Claims, 28 Drawing Sheets

(56) References Cited

U.S. PATENT DOCUMENTS

| | | |
|---|---|---|
| 2013/0271633 A1 | 10/2013 | Hashimoto et al. |
| 2014/0252207 A1* | 9/2014 | Okamoto ............... H04N 5/378 250/208.1 |
| 2018/0302578 A1 | 10/2018 | Ebihara |
| 2020/0013320 A1* | 1/2020 | Yamamoto ......... G01R 31/2884 |

* cited by examiner

SOLID-STATE IMAGING DEVICE, METHOD FOR DRIVING SOLID-STATE IMAGING DEVICE, AND ELECTRONIC APPARATUS HAVING AN AMPLIFIER WITH AN INVERTING INPUT TERMINAL HAVING AT LEAST A FIRST INVERTING INPUT CHANNEL AND A SECOND INVERTING INPUT CHANNEL

CROSS-REFERENCE TO RELATED APPLICATIONS

This application is based on and claims the benefit of priority from Japanese Patent Application Serial No. 2019-006163 (filed on Jan. 17, 2019), the contents of which are hereby incorporated by reference in their entirety.

TECHNICAL FIELD

The present invention relates to a solid-state imaging device, a method for driving a solid-state imaging device, and an electronic apparatus.

BACKGROUND

Solid-state imaging devices (image sensors) including photoelectric conversion elements for detecting light and generating charges are embodied as CMOS (complementary metal oxide semiconductor) image sensors, which have been in practical use. The CMOS image sensors have been widely applied as parts of various types of electronic apparatuses such as digital cameras, video cameras, surveillance cameras, medical endoscopes, personal computers (PCs), mobile phones and other portable terminals (mobile devices).

A CMOS image sensor includes, for each pixel, a photodiode (a photoelectric conversion element) and a floating diffusion (FD) amplifier having a floating diffusion (FD). The mainstream design of the reading operation in CMOS image sensors is a column parallel output processing performed by selecting a row in a pixel array and reading the pixels simultaneously in the column direction.

Each pixel of a solid-state imaging device (CMOS image sensor) includes, for example, for one photodiode (photoelectric conversion element), one each of: a transfer transistor serving as a transfer element, a reset transistor serving as a reset element, a source follower transistor serving as a source follower element, and a selection transistor serving as a selection element. Such a pixel has a four transistor (4Tr) construction.

The transfer transistor remains selected and in the conduction state during a transfer period to transfer to the floating diffusion FD the charges (electrons) produced by the photoelectric conversion and then stored in the photodiode. The reset transistor remains selected and in the conduction state during a reset period to reset the floating diffusion FD to the potential of a power supply line. The selection transistor remains selected and in the conduction state in a reading scan operation. Thus, the source follower transistor outputs, to the vertical signal line, a read-out signal of a column output generated by converting the charges of the floating diffusion FD to a voltage signal with a gain corresponding to a quantity of the charges (the potential).

For example, in a reading scan period, the floating diffusion FD is reset to the potential of the power supply line (the reference potential) in a reset period, and then the charges of the floating diffusion FD are converted by the source follower transistor to a voltage signal with a gain corresponding to a quantity of the charges (the potential) and output to the vertical signal line as a read-out reset signal Vrst (a signal at the reference level). Subsequently, in a transfer period, the charges (electrons) produced by the photoelectric conversion and then stored in the photodiode are transferred to the floating diffusion FD. The charges of the floating diffusion FD are converted by the source follower transistor to a voltage signal with a gain corresponding to a quantity of the charges (the potential) and output to the vertical signal line as a read-out signal Vsig at the signal level (a signal at the signal level). The output signal from the pixel is subjected to the CDS (correlated double sampling) process as a differential signal (Vsig−Vrst) in a column reading circuit.

In this way, an ordinary pixel read-out signal (hereinafter also referred to as "pixel signal") PS is formed of one read-out reset signal Vrst at the reference level and one read-out signal Vsig at the signal level.

To improve characteristics, various methods have been proposed for fabricating a solid-state imaging device (CMOS image sensor) that has a high dynamic range (HDR) and provides a high picture quality (see, for example, Japanese Patent No. 3984814 ("the '814 Patent")).

Methods of increasing (extending) a dynamic range in a solid-state imaging device include, for example, a method including reading two types of signals having different storage times from the same pixel of an image sensor and then combining these two types of signals so as to extend the dynamic range, and a method including combining a signal of a low illuminance region obtained from a high sensitivity pixel and a signal of a high illuminance region obtained from a low sensitivity pixel so as to extend the dynamic range.

For example, the '814 Patent discloses a dynamic range increasing technology that includes dividing the exposure period into two or more exposure sessions of different durations, including short-exposure imaging for high illuminance and long-exposure imaging for low illuminance.

A pixel read-out signal (pixel signal) PSD obtained by the dynamic range increasing technology is formed of a plurality M (e.g., M=2) of read-out reset signals Vrst at the reference levels (signals at the reference levels) and the plurality M (M=2) of read-out signals Vsig at the signal levels (signals at the signal levels). The pixel read-out signal (pixel signal) PSD thus formed is processed as what is called an uninterrupted read-out signal (see, for example, Japanese Patent Application Publication No. 2016-2813).

Part (A) and Part (B) of FIG. 1 show examples of an ordinary pixel read-out signal (pixel signal) of a solid-state imaging device (CMOS image sensor) and an uninterrupted pixel read-out signal (uninterrupted pixel signal) obtained by the dynamic range increasing technology. Part (A) of FIG. 1 shows an example of the ordinary pixel read-out signal (pixel signal) PS, and Part (B) of FIG. 1 shows an example of the uninterrupted pixel read-out signal (uninterrupted pixel signal) PSD.

As shown in Part (A) of FIG. 1, an ordinary pixel signal PS[N] is formed of one read-out reset signal Vrst[N] at the reference level (hereinafter also referred to simply as "the reference level") and one read-out signal Vsig[N] at the signal level (hereinafter also referred to simply as "the signal level"). That is, one pixel signal PS[N] includes one reference level Vrst[N] and one signal level Vsig[N]. Output data OD[N] is the reference level (the read-out reset signal) Vrst[N] minus the signal level (the read-out signal) Vsig[N]. Likewise, one pixel signal PS[N+1] includes one reference level (read-out reset signal) Vrst[N+1] and one signal level (read-out signal) Vsig[N+1]. Output data OD[N+1] is the reference level (the read-out reset signal) Vrst[N+1] minus the signal level (the read-out signal) Vsig[N+1].

As for an uninterrupted pixel signal PSD[N], as shown in Part (B) of FIG. 1, one pixel signal PSD[N] includes M (M=2 in this example) reference levels (read-out reset signals) Vrst[N,1], Vrst[N,2] and M signal levels (read-out signals) Vsig[N,1], Vsig[N,2]. That is, one uninterrupted pixel signal PSD[N] includes M reference levels (read-out reset signals) Vrst[N,1], Vrst[N,2] and M signal levels (read-out signals) Vsig[N,1], Vsig[N,2]. Output data OD[N, 1] is the reference level (the read-out reset signal) Vrst[N,1] minus the signal level (the read-out signal) Vsig[N,1], and output data OD[N,2] is the reference level (the read-out reset signal) Vrst[N,2] minus the signal level (the read-out signal) Vsig[N,2]. Likewise, one uninterrupted pixel signal PSD [N+1] includes M reference levels (read-out reset signals) Vrst[N+1,1], Vrst[N+1,2] and M signal levels (read-out signals) Vsig[N+1,1], Vsig[N+1,2]. Output data OD[N+1,1] is the reference level (the read-out reset signal) Vrst[N+1,1] minus the signal level (the read-out signal) Vsig[N+1,1], and output data OD[N+1,2] is the reference level (the read-out reset signal) Vrst[N+1,2] minus the signal level (the read-out signal) Vsig[N+1,2].

As described above, the uninterrupted pixel signal PSD is formed such that one pixel signal PSD includes M reference levels (read-out reset signals) Vrst and M signal levels (read-out signals) Vsig, and these levels may be arranged in a plurality of orders under restriction that a reference level (read-out reset signal) Vrst[N,M] necessarily precedes the corresponding signal level (read-out signal) Vsig[N, M] for the same output data OD[N,M]. Part (B) of FIG. 1 shows one of the possible arrangements for the case where M=2.

FIG. 2 illustrates a method of increasing (extending) a dynamic range in a solid-state imaging device, or more specifically, a combination method for generating an uninterrupted pixel signal for the case where the number M of read-out signals to be combined is two (M=2).

In an uninterrupted pixel signal PSD, M signals may have different gains K for the same amount of light. FIG. 2 shows an example in which M=2 and a ratio of gain K(M=1)/K(M=2)=4.

The output data OD[*,1] and the output data OD[*,2] obtained from the uninterrupted pixel signals PSD shown in Part (B) of FIG. 1 are signals having different gradients as shown in Part (A) of FIG. 2. In the combination process, the output data OD[*,2] is amplified in accordance with the ratio thereof, thereby to obtain a single combined final output data ODA as shown in Part (B) of FIG. 2. For example, the output data OD[*,1] is obtained by high conversion gain (second conversion gain) mode reading (HCG), and the output data OD[*,2] is obtained by low conversion gain (first conversion gain) mode reading (LCG).

The combination process employs a first method of switching shown in Part (C) of FIG. 2 or a second method of averaging shown in Part (D) of FIG. 2, to generate the final output data ODA.

Therefore, in the first method, the boundary (coupling position (point)) [X] is remarkably emphasized by an error, and the second method used to alleviate such emphasis includes operation that requires two output data, OD[*,1] and OD[*,2], resulting in further complicated signal processing.

A description will be hereinafter given of a circuit system for processing pixel read-out signals (pixel signals) configured to reduce (eliminate) random variation between pixels. The following description is related to generation of output data for the ordinary pixel signals.

FIG. 3 shows an example of a reading circuit capable of setting a new reference level in a processing system for the ordinary pixel read-out signals (pixel signals). In FIG. 3, the pixels PXL(N), PXL(N+1) in the same column are connected to a common reading signal line LS. A clamp circuit 1 for setting a new reference level is disposed in an input stage between the signal line LS and an input node [Y] of an analog digital converter (ADC) (not shown). The clamp circuit 1 includes an amplifier AMP1, capacitors C1, C2, and a switch SW1.

For example, in the processing of the ordinary pixel read-out signals (pixel signals) PS shown in Part (A) of FIG. 1, the reference level Vrst[N] and the reference level Vrst [N+1] may be different from each other due to random variation between the pixels PXL. Therefore, in the example of the reading circuit shown in FIG. 3, a new reference level [V1] provided by the clamp circuit 1 is used to eliminate the random variation between the pixels.

FIGS. 4A and 4B show an example of the ordinary pixel read-out signal (pixel signal) generated when the new reference level Vrst[V1] provided by the clamp circuit 1 is applied. FIG. 4A shows the clamp circuit of FIG. 3 simplified into a capacitor C and the switch SW1, and FIG. 4B shows an example of the ordinary pixel read-out signal (pixel signal).

As shown in FIGS. 4A and 4B, when the switch SW1 in the clamp circuit 1 is turned into the ON state by a clamp signal CLP, the new reference level [V1] is used to change the reference level Vrst appearing at the node [Y]. At this time, the signal level Vsig[N] is a new signal level Vsig[N'] based on the new reference level [V1]. In this case, the difference between the reference level [V1] and the signal level Vsig[N'] remains unchanged.

FIG. 5 shows an example configuration of a clamp circuit disposed in an input part of an ADC included in a reading system of a column output from a pixel part in the solid-state imaging device, the solid-state imaging device being capable of eliminating random variation affecting the uninterrupted pixel read-out signals (uninterrupted pixel signals) PSD. FIG. 5 shows an example of the input stage of the clamp circuit. The clamp circuit 1A, which is not simplified, includes the amplifier AMP1, the capacitors C1, C2, and the switch SW1. FIG. 6 shows an example operation of the circuit of FIG. 5.

This reading system basically includes two clamp circuits. In the clamp circuit 1A, the amplifier AMP1, the capacitor C2, and the switch SW1 constitute a clamp part 1B for shared use, and only path selecting switches 2-21, 2-22 and capacitors C1-1, C1-2 are provided separately for the two clamp circuits. This arrangement suppresses increase of the circuit area.

The circuit of FIG. 5 includes a path selecting unit 2 disposed on the input side of the clamp part 1B in the clamp circuit 1A. The path selecting part 2 includes a plurality of signal paths 2-11[A], 2-12[B] that respectively carry the plurality (i.e., two in this example) of reading signals read out from the pixels PXL for combination, such that each of the read-out signals is transmitted through any one of the signal paths 2-11, 2-12 and supplied to the clamp part 1B. The path selecting part 2 is disposed on each of the signal paths 2-11[A], 2-12[B], and it includes path selecting switches 2-21, 2-22 that switch the signal paths 2-11, 2-12, respectively, between a connected state and a non-connected state in accordance with respective path selecting signals WA, WB. The capacitor C1-1 is disposed in the signal path 2-11, and the capacitor C1-2 is disposed in the signal path 2-12.

The reading system of FIG. 5 mainly has the following disadvantages.

The CDS process on the output signals of the pixels removes kTC noise in the floating diffusion of each pixel.

For the second conversion gain (high conversion gain) mode reading (HCG), amplifier reset is performed once, which causes reset noise of the amplifier to be retained in the capacitors, and the AD conversion process is performed twice on the reference level (read-out reset signal) Vrst and the signal level (read-out signal) Vsig and a subtraction process is performed in a digital region. The CDS process in the second conversion gain (high conversion gain) mode reading (HCG) results in reset noise cancellation of dark signals.

For the first conversion gain (low conversion gain) mode reading (LCG), amplifier reset is performed twice, and the AD conversion process is performed twice on the reference level (read-out reset signal) Vrst and the signal level (read-out signal) Vsig both including uncorrelated amplifier reset noise, and the CDS process is not performed. Since the CDS process is not performed in the first conversion gain (low conversion gain mode reading (LCG), reset noise occurs in bright signals for √2 times.

As a result, as shown in FIG. 7, a noise gap occurs at a connection point between the output data of the pixels obtained by the low conversion gain (first conversion gain) mode reading (LCG) and the output data of the pixels obtained by the high conversion gain (second conversion gain) mode reading (HCG), and the noise gap is shown in the capture image of a gradation chart, which is visible as what is called a noise band.

SUMMARY

An object of the present invention is to provide a solid-state imaging device, a method for driving a solid-state imaging device, and an electronic apparatus capable of removing a noise gap at a connection point between the low conversion gain data and the high conversion gain data, suppressing increase of power consumption and circuit areas, providing a wide dynamic range, and thus achieving high image quality.

The first aspect of the present invention is a solid-state imaging device providing an extended dynamic range by combining a plurality of read-out signals each formed of a signal at a reference level and a signal at a signal level, the solid-state imaging device comprising: a pixel part including a pixel arranged therein; and a reading part including a column signal processing part arranged so as to correspond to a column output of the pixel part, wherein the column signal processing part includes an amplifying part for amplifying the plurality of read-out signals read out from the pixel, and wherein the amplifying part includes: an amplifier including an inverting input terminal and a non-inverting input terminal, the inverting input terminal having at least a first inverting input channel and a second inverting input channel; a first node to which the plurality of read-out signals are input; a second node connected to the first inverting input channel; a third node connected to the second inverting input channel; a fourth node connected to an output terminal of the amplifier; a fifth node connected to the fourth node via a first output switch; a sixth node connected to the fourth node via a second output switch; a first input switch and a first sampling capacitor connected in series between the first node and the second node; a second input switch and a second sampling capacitor connected in series between the first node and the third node; a first feedback capacitor connected between the second node and the fifth node; and a second feedback capacitor connected between the third node and the sixth node.

The second aspect of the present invention is a method of driving a solid-state imaging device providing an extended dynamic range by combining a plurality of read-out signals each formed of a signal at a reference level and a signal at a signal level, the solid-state imaging device including: a pixel part including a pixel arranged therein; and a reading part including a column signal processing part arranged so as to correspond to a column output of the pixel part, wherein the pixel includes: a photoelectric conversion element for storing therein, in a storage period, charges generated by photoelectric conversion; a transfer element for transferring, in a transfer period, the charges stored in the photoelectric conversion element; a floating diffusion to which the charges stored in the photoelectric conversion element are transferred through the transfer element; a source follower element for converting the charges in the floating diffusion into a voltage signal at a level corresponding to the quantity of the charges and outputting the voltage signal to an output node; and a reset element for resetting, in a reset period, the floating diffusion to a predetermined potential, and wherein the column signal processing part includes an amplifying part for amplifying the plurality of read-out signals read out from the pixel, wherein the amplifying part includes: an amplifier including an inverting input terminal and a non-inverting input terminal, the inverting input terminal having at least a first inverting input channel and a second inverting input channel; a first node to which the plurality of read-out signals are input; a second node connected to the first inverting input channel; a third node connected to the second inverting input channel; a fourth node connected to an output terminal of the amplifier; a fifth node connected to the fourth node via a first output switch; a sixth node connected to the fourth node via a second output switch; a first input switch and a first sampling capacitor connected in series between the first node and the second node; a second input switch and a second sampling capacitor connected in series between the first node and the third node; a first feedback capacitor connected between the second node and the fifth node; and a second feedback capacitor connected between the third node and the sixth node, and wherein a capacitance of the second sampling capacitor is larger than that of the first sampling capacitor, the method comprising: resetting the floating diffusion through the reset element in the reset period; reading out and amplifying, at least in a first reading period after the reset period, a first reset signal by first conversion gain mode reading (LCG), while retaining the first input switch and the first output switch in a conduction state for a predetermined period; switching, after reading out the first reset signal, the first input switch and the first output switch to a non-conduction state; switching the second input switch and the second output switch to the conduction state, and reading out and amplifying a second reset signal by second conversion gain mode reading (HCG); causing, in a transfer period after the first reading period, the charges stored in the photoelectric conversion element to be transferred to the floating diffusion through the transfer element; reading out and amplifying, in a second reading period after the transfer period, a second read-out signal by the second conversion gain mode reading (HCG), while retaining the second input switch and the second output switch in the conduction state; and switching, after reading out the second read-out signal, the second input switch and the second output switch to the non-conduction state, switching the first input switch and the first output switch to the conduction state, and reading out and amplifying a first reading signal by the first conversion gain mode reading (LCG).

The third aspect of the present invention is an electronic apparatus comprising: a solid-state imaging device providing an extended dynamic range by combining a plurality of read-out signals each formed of a signal at a reference level and a signal at a signal level; and an optical system for forming a subject image on the solid-state imaging device, wherein the solid-state imaging device includes: a pixel part including a pixel arranged therein; and a reading part including a column signal processing part arranged so as to correspond to a column output of the pixel part, wherein the column signal processing part includes an amplifying part for amplifying the plurality of read-out signals read out from the pixel, and wherein the amplifying part includes: an amplifier including an inverting input terminal and a non-inverting input terminal, the inverting input terminal having at least a first inverting input channel and a second inverting input channel; a first node to which the plurality of read-out signals are input; a second node connected to the first inverting input channel; a third node connected to the second inverting input channel; a fourth node connected to an output terminal of the amplifier; a fifth node connected to the fourth node via a first output switch; a sixth node connected to the fourth node via a second output switch; a first input switch and a first sampling capacitor connected in series between the first node and the second node; a second input switch and a second sampling capacitor connected in series between the first node and the third node; a first feedback capacitor connected between the second node and the fifth node; and a second feedback capacitor connected between the third node and the sixth node.

ADVANTAGES

With the present invention, it is possible to remove a noise gap at a connection point between the low conversion gain data and the high conversion gain data, suppress increase of power consumption and circuit areas, provide a wide dynamic range, and thus achieve high image quality.

DESCRIPTION OF THE EMBODIMENTS

Embodiments of the present invention will be hereinafter described with reference to the drawings.

First Embodiment

Figure 1:
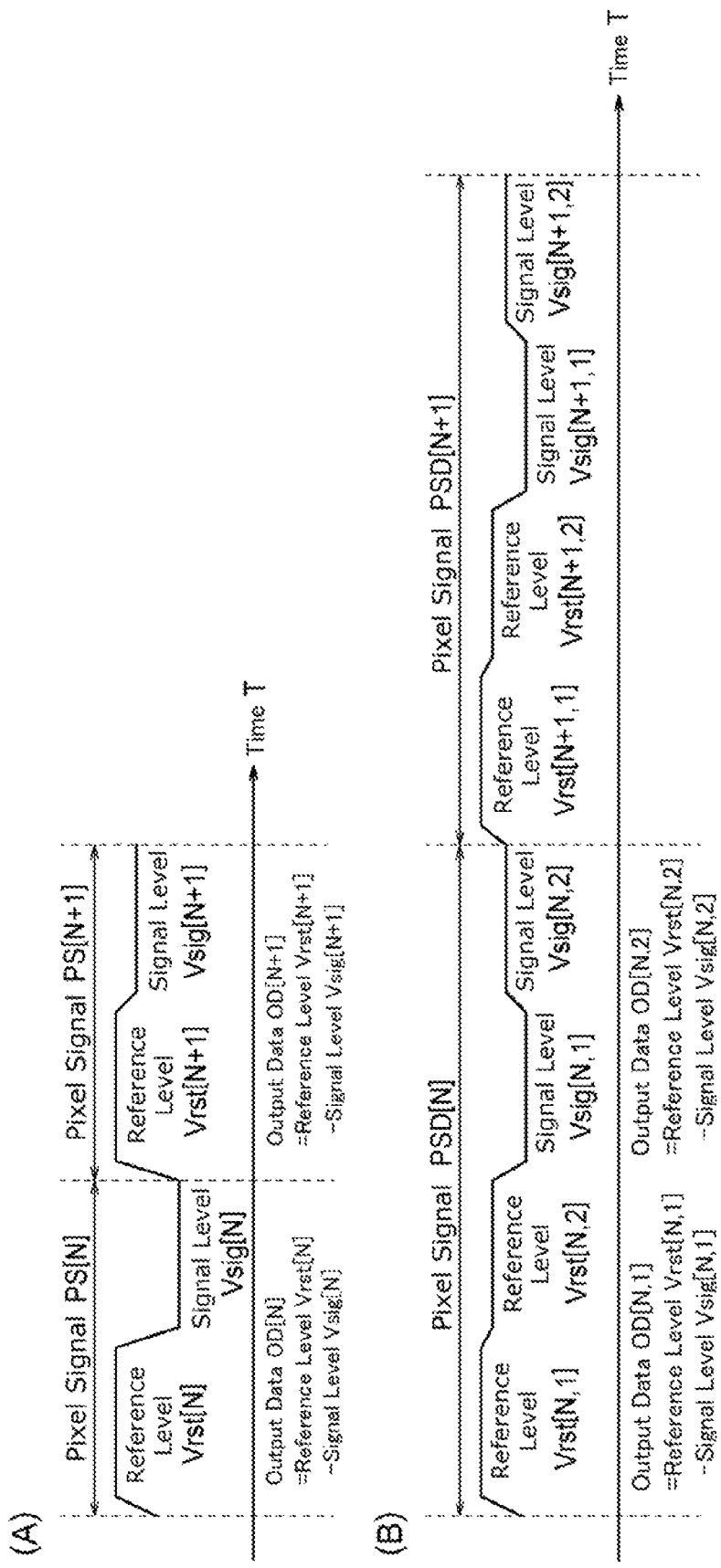
FIG. 1 shows examples of an ordinary pixel read-out signal (pixel signal) of a solid-state imaging device (CMOS image sensor) and an uninterrupted pixel read-out signal (uninterrupted pixel signal) obtained by the dynamic range increasing technology.
Figure 2:
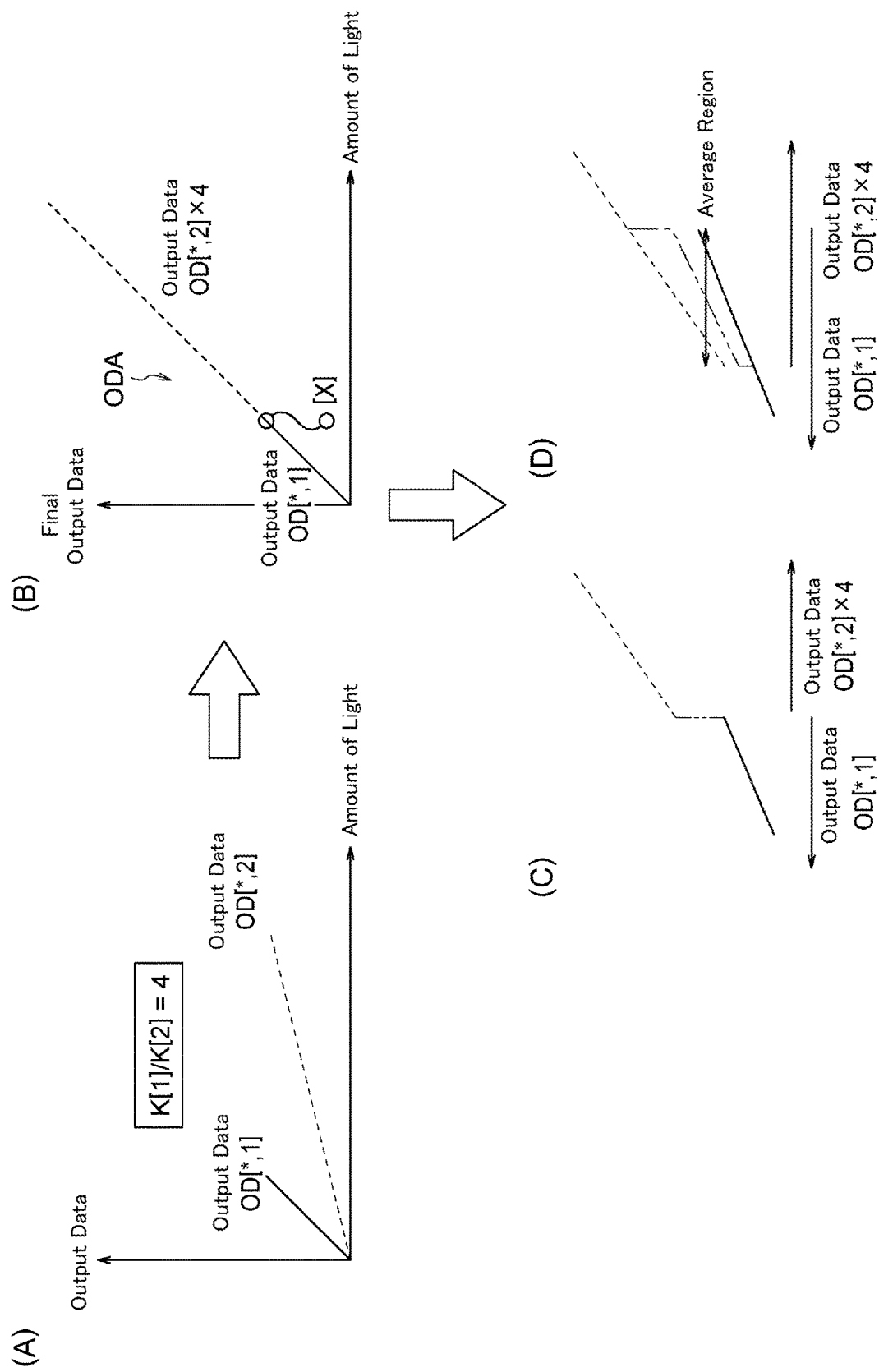
FIG. 2 illustrates a method of increasing (extending) a dynamic range in a solid-state imaging device, or more specifically, a combination method for generating an uninterrupted pixel signal for the case where the number M of read-out signals to be combined is two (M=2).
Figure 3:
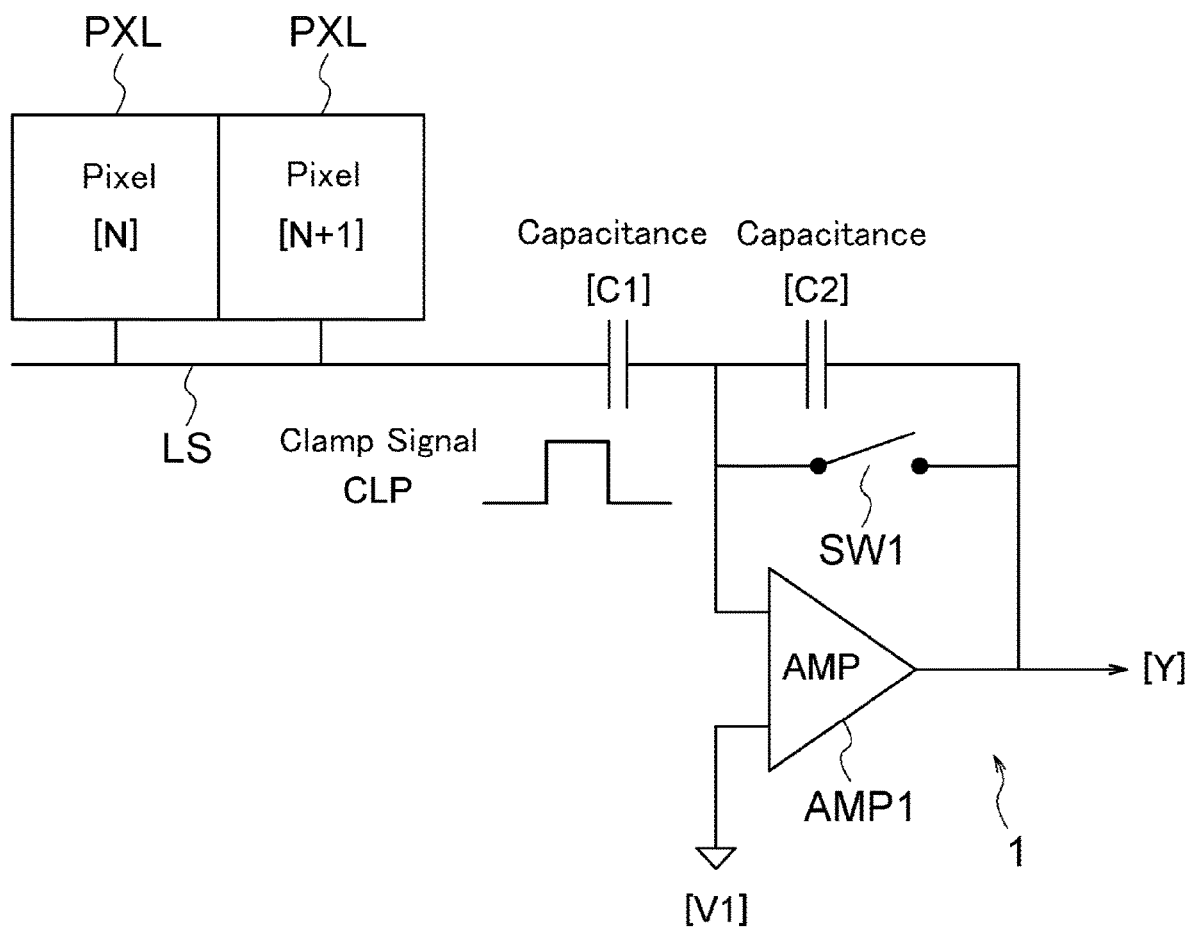
FIG. 3 shows an example of a reading circuit capable of setting a new reference level in a processing system for the ordinary pixel read-out signals (pixel signals).
Figure 4A:
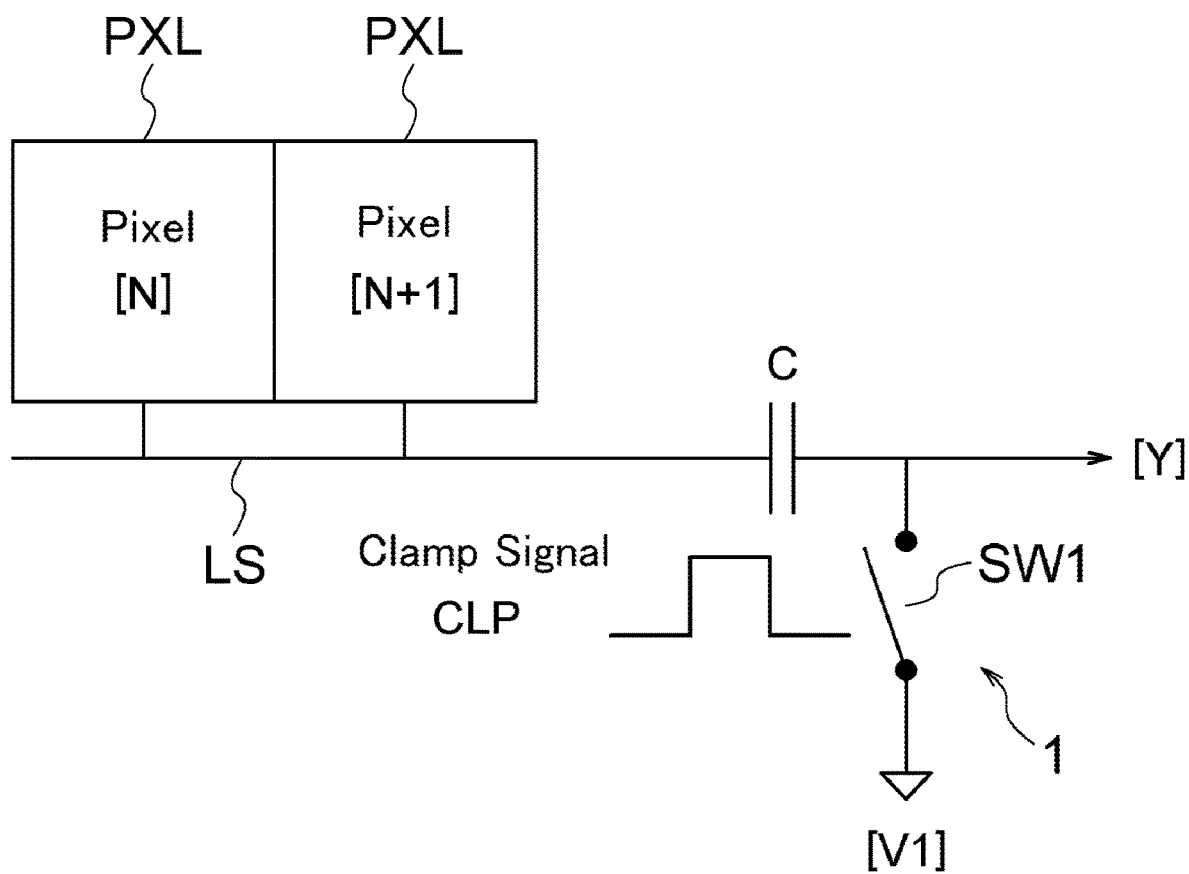
FIGS. 4A and 4B show an example of the ordinary pixel read-out signal (pixel signal) generated when the new reference level provided by the clamp circuit is applied.
Figure 4B:
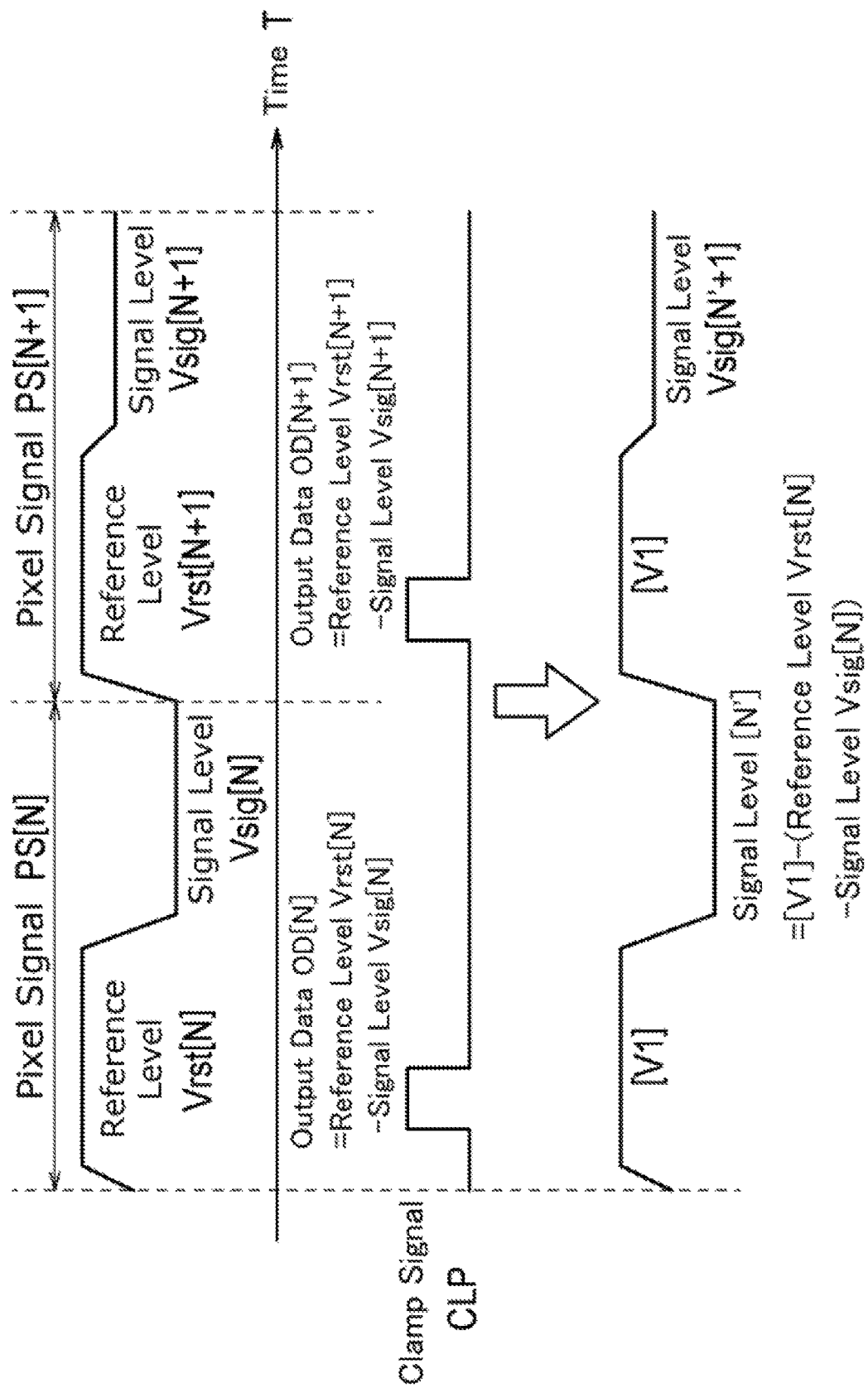
Figure 5:
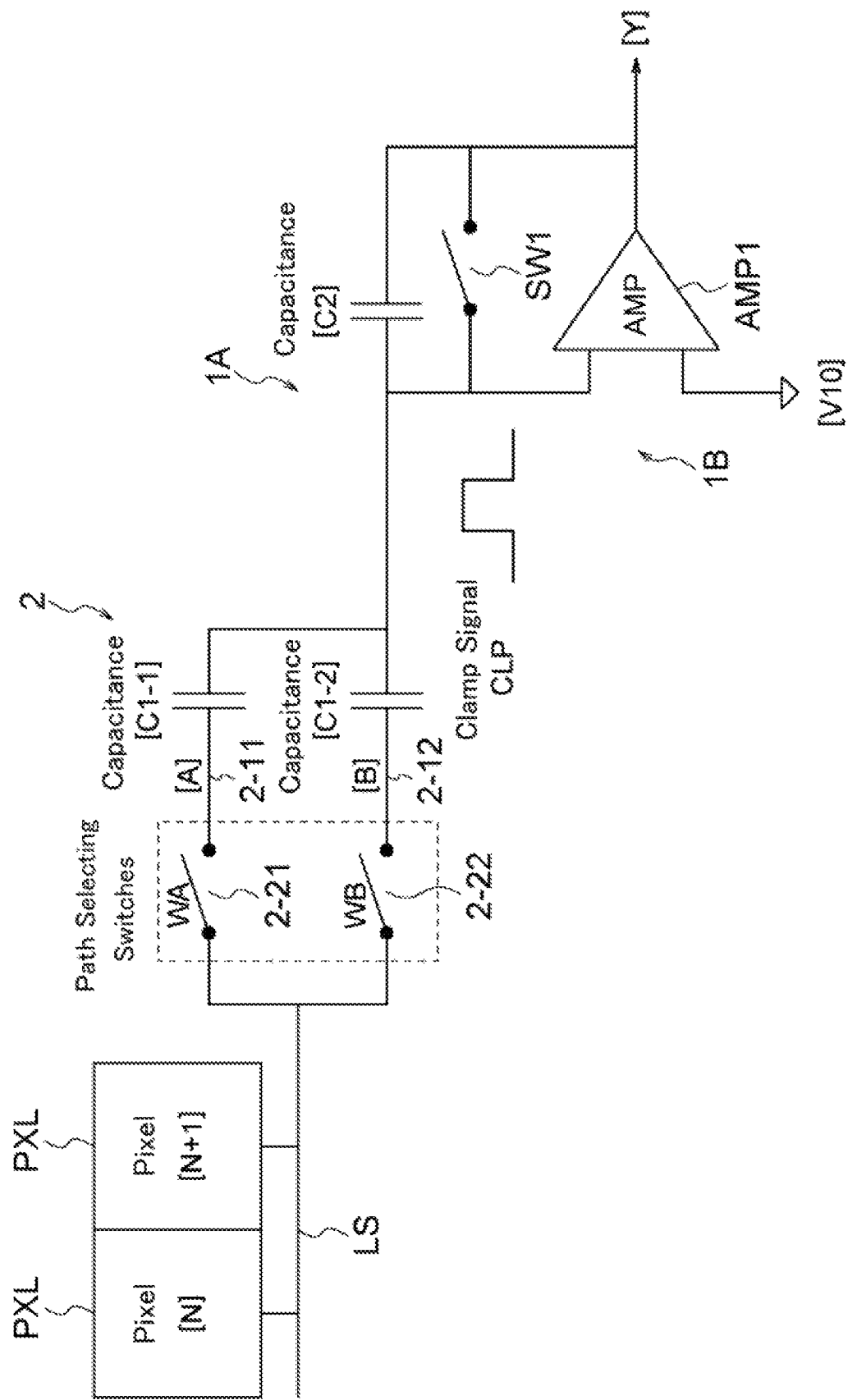
FIG. 5 shows an example configuration of a clamp circuit disposed in an input part of an ADC included in a reading system of a column output from a pixel part in the solid-state imaging device, the solid-state imaging device being capable of eliminating random variation affecting the uninterrupted pixel read-out signals (uninterrupted pixel signals) PSD.
Figure 6:
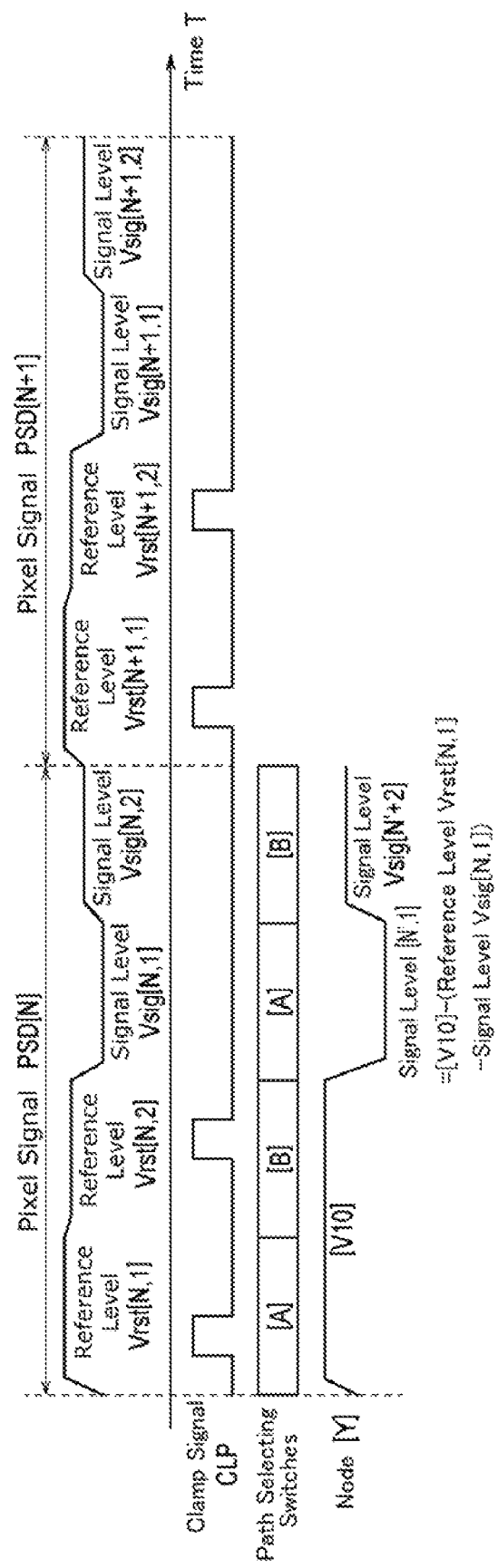
FIG. 6 shows an example operation of the circuit of FIG. 5.
Figure 7:
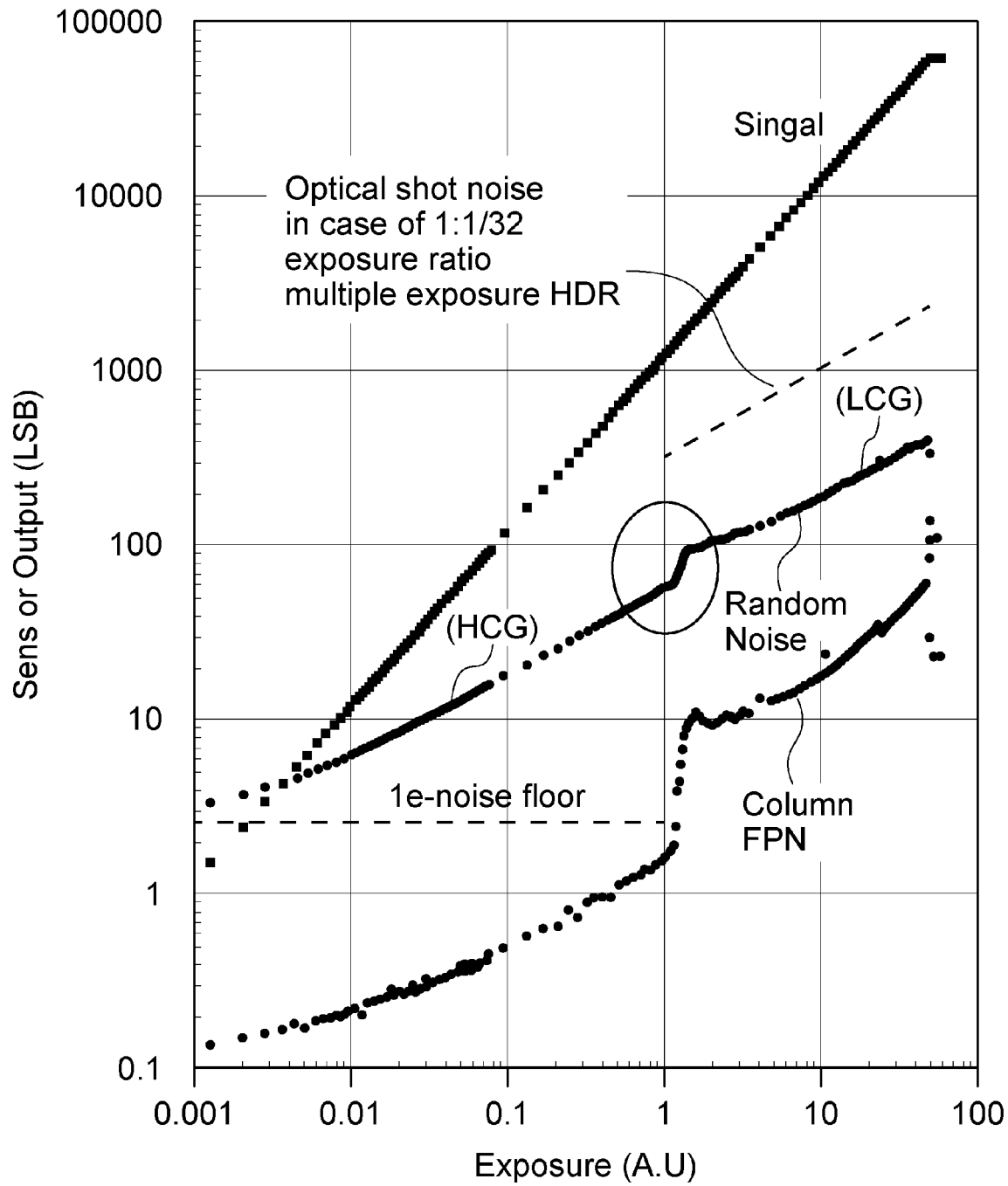
FIG. 7 is used to explain a problem of the circuit of FIG. 5.
Figure 8:
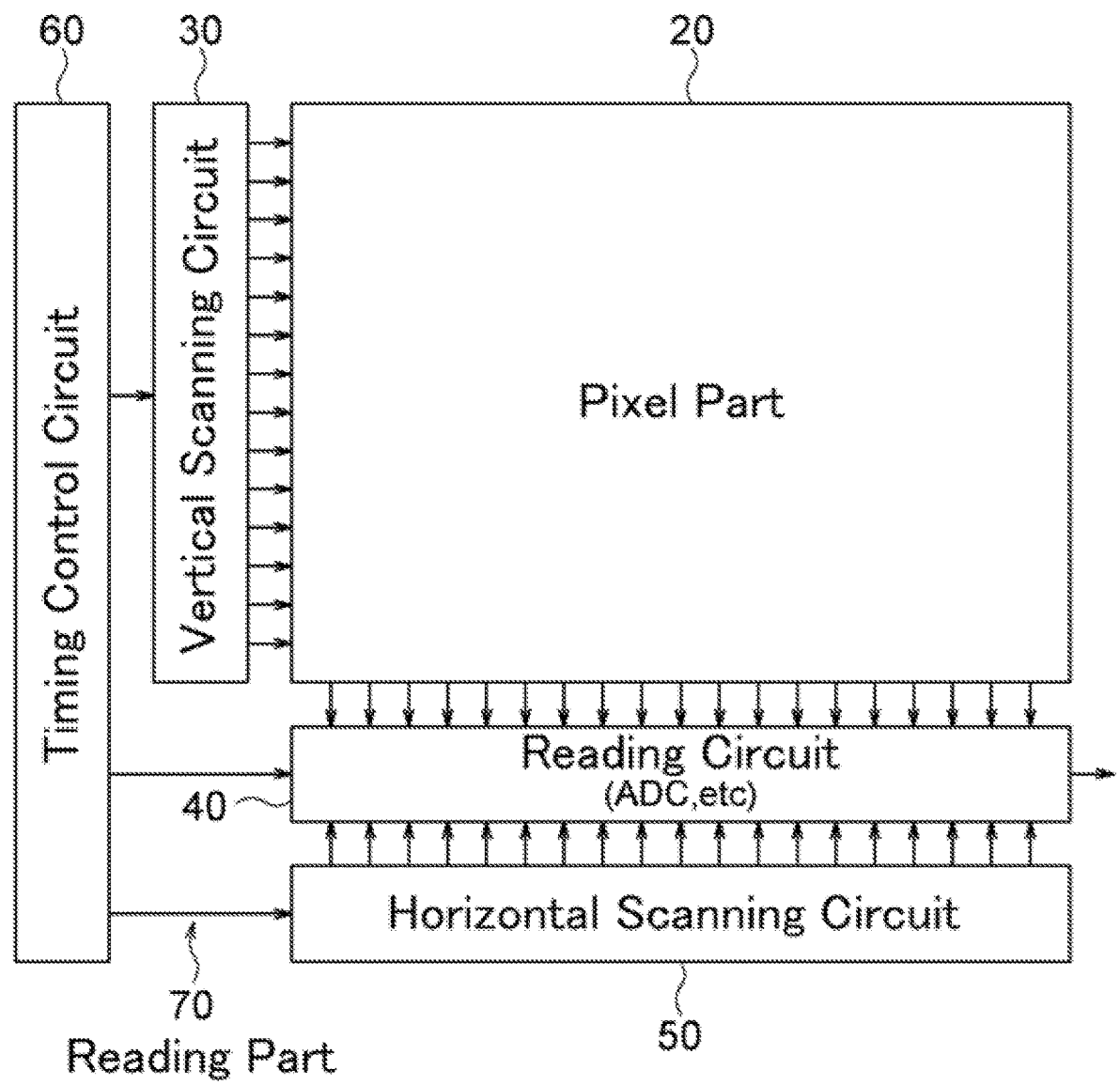
FIG. 8 is a block diagram showing a configuration of a solid-state imaging device according to a first embodiment of the present invention.

FIG. 8 is a block diagram showing an example configuration of a solid-state imaging device relating to a first embodiment of the present invention. In this embodiment, the solid-state imaging device 10 is constituted by, for example, a CMOS image sensor.

As shown in FIG. 8, the solid-state imaging device 10 is constituted mainly by a pixel part 20 serving as an image capturing part, a vertical scanning circuit (a row scanning circuit) 30, a reading circuit (a column reading circuit) 40, a horizontal scanning circuit (a column scanning circuit) 50, and a timing control circuit 60. Among these components, for example, the vertical scanning circuit 30, the reading circuit 40, the horizontal scanning circuit 50, and the timing control circuit 60 constitute the reading part 70 for reading out pixel signals.

In the embodiment, as will be described later, the solid-state imaging device 10 is configured such that a plurality M (e.g., M=2) of read-out signals (pixel signals) read out from the pixel part 20 are combined to extend the dynamic range.

One example of the method of increasing (extending) the dynamic range is to read out a plurality M (e.g., M=2) of types of signals having different storage times from the same pixel of an image sensor and then combine these M types of signals so as to extend the dynamic range. Another example of the method of increasing (extending) the dynamic range is to combine a signal of a low illuminance region obtained from a high sensitivity pixel and a signal of a high illuminance region obtained from a low sensitivity pixel so as to extend the dynamic range.

In the embodiment, a pixel read-out signal (pixel signal) PSD obtained by the dynamic range increasing technology is formed of the plurality M (e.g., M=2, 4, . . . ) of read-out reset voltages Vrst at the reference levels (signals at the reference levels) and the plurality M of read-out signal voltages Vsig at the signal levels (signals at the signal levels). The pixel read-out signal (pixel signal) PSD thus formed is processed as what is called an uninterrupted read-out signal.

As described above, in the embodiment, the uninterrupted pixel signal PSD is formed such that one pixel signal PSD includes M reference levels (signals at the reference levels) Vrst and M signal levels (signals at the signal levels) Vsig. In the embodiment, these levels in the uninterrupted pixel signal PSD may be arranged in a plurality of orders under restriction that a reference level (read-out reset signal) Vrst[N,M] necessarily precedes the corresponding signal level (read-out signal) Vsig[N, M] for the same output data OD[N,M].

In the first embodiment, the reading circuit 40 includes a plurality of column signal processing parts arranged so as to correspond to the column outputs of the pixel part 20, and each of the column signal processing parts includes an amplifying part and an ADC. The amplifying part amplifies a plurality of read-out reset signals and a plurality of read-out signals in the uninterrupted pixel signal PSD read out from the pixel, and the ADC performs AD conversion to convert the output of the amplifying part from an analog signal to a digital signal. In the present invention, an inverting input terminal (−) of the amplifier included in the amplifying part has at least two inverting input channels, a first inverting input channel and a second inverting input channel, such that it is possible to remove a noise gap at a connection point between the low conversion gain data and the high conversion gain data, suppress increase of power consumption and circuit areas, provide a wide dynamic range, and thus achieve high image quality. This will be further descried later.

In the first embodiment, the reading circuit 40 can perform first conversion gain mode reading (LCG) and second conversion gain mode reading (HCG) in a single reading period. In the first conversion gain mode reading (LCG), the reading circuit 40 reads pixel signals with a first conversion gain (e.g., a low conversion gain), and in the second conversion gain mode reading (HCG), the reading circuit 40 reads pixel signals with a second conversion gain (e.g., a high conversion gain). That is, the solid-state imaging device 10 of the embodiment is a solid-state imaging element with a wide dynamic range that is configured to output both bright signals and dark signals by switching, in a single reading period, the interior of the pixels between a first conversion gain (e.g., a low conversion gain) mode and a second conversion gain (e.g., a high conversion gain) mode for outputting signals generated from the charges (electrons) produced by the photoelectric conversion in a single storage period (exposure period).

The reading circuit 40 of the first embodiment basically performs the first conversion gain mode reading (LCG) and the second conversion gain mode reading (HCG) in the storage period subsequent to the reset period in which the charges of the photodiode and the floating diffusion are discharged. In the embodiment, the reading circuit 40 performs at least one of the first conversion gain mode reading (LCG) and the second conversion gain mode reading (HCG) in the reading period after at least one transfer period performed after the reading period subsequent to the reset period. In the embodiment, the reading circuit 40 performs both the first conversion gain mode reading (LCG) and the second conversion gain mode reading (HCG) in the reading period after the transfer period.

In a normal pixel reading operation, the vertical scanning circuit 30 drives the pixels in such a manner that shutter scan is followed by reading scan. The first conversion gain mode reading (LCG) and the second conversion gain mode reading (HCG) are performed in the reading scan period.

A description will be hereinafter given of an outline of the configurations and functions of the parts of the solid-state imaging device 10, followed by details of configuration of the amplifying parts in the column signal processing parts serving as a column processing system of the reading circuit 40 and a reading process related thereto.

<Configurations of Pixel Part 20 and Pixels PXL>

In the pixel part 20, a plurality of pixels each including a photodiode (a photoelectric conversion element) and an in-pixel amplifier are arranged in a two-dimensional matrix comprised of N rows and M columns.

Figure 9:
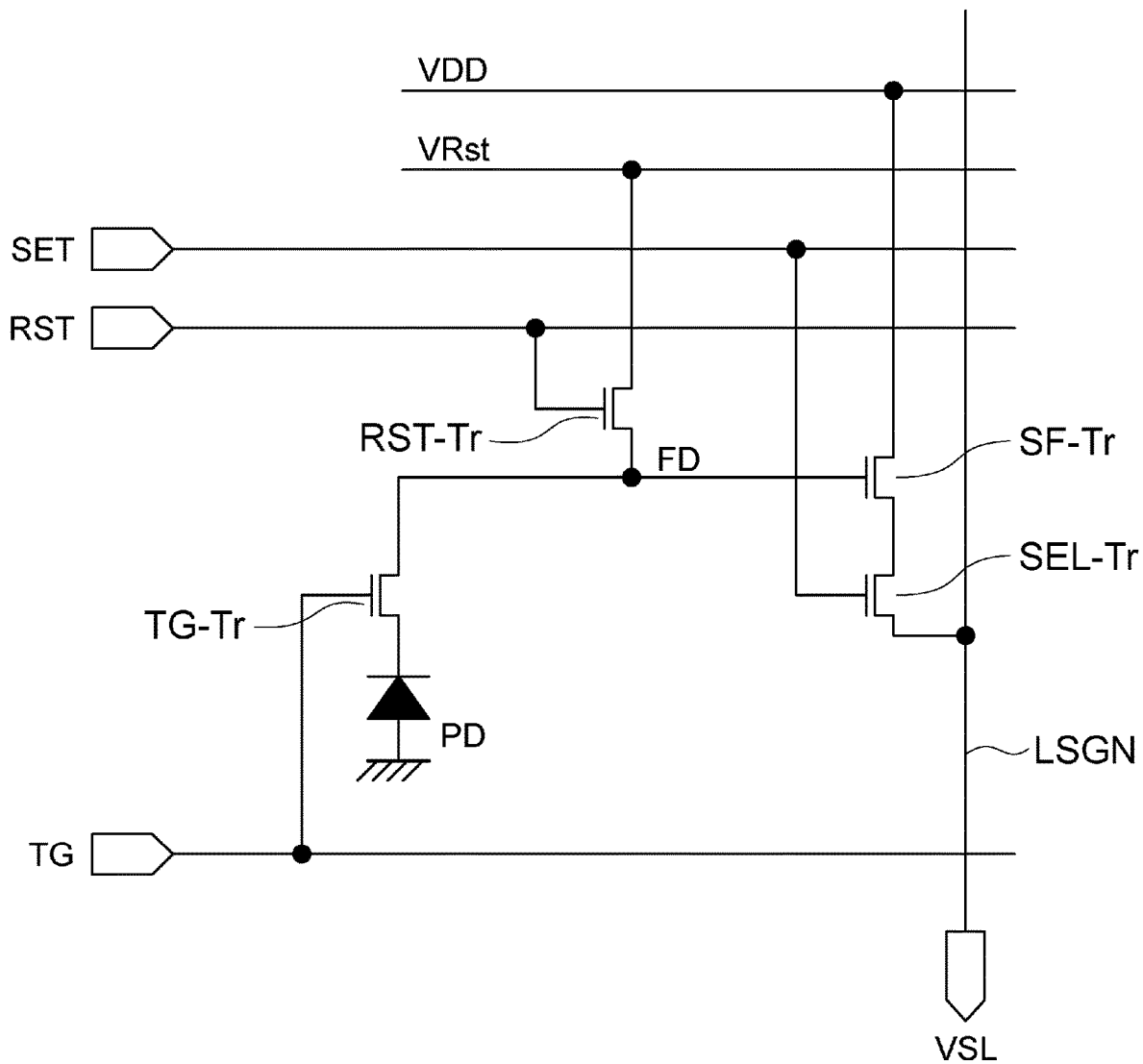
FIG. 9 is a circuit diagram showing an example of a pixel according to the first embodiment.

FIG. 9 is a circuit diagram showing an example of a pixel according to the embodiment.

The pixel PXL includes, for example, a photodiode (PD) serving as a photoelectric conversion part (a photoelectric conversion element). For the photodiode PD, the pixel PXL includes one each of the following: a transfer transistor TG-Tr serving as a charge transfer gate part (a transfer element), a reset transistor RST-Tr serving as a reset element, a source follower transistor SF-Tr serving as a source follower element, and a selection transistor SEL-Tr serving as a selection element.

The photodiode PD generates signal charges (electrons) in an amount in accordance with the quantity of the incident light and stores the generated signal charges. A description will be hereinafter given of a case where the signal charges are electrons and each transistor is an n-type transistor. However, it is also possible that the signal charges are holes or each transistor is a p-type transistor. Further, this embodiment is also applicable to the case where a plurality of photodiodes share the transistors or the case where the pixel includes three transistors (3Tr) other than the selection transistor.

The photodiode (PD) in each pixel PXL is a pinned photodiode (PPD). On a substrate surface for forming the photodiodes (PD), there is a surface level due to dangling bonds or other defects, and therefore, a lot of charges (dark current) are generated due to heat energy, so that signals fail to be read out correctly. In a pinned photodiode (PPD), a charge storage part of the photodiode (PD) is buried in the substrate to reduce mixing of the dark current into signals.

The transfer transistor TG-Tr is connected between the photodiode PD and the floating diffusion FD and controlled by a control signal TG applied to the gate thereof through a control line. The transfer transistor TG-Tr remains selected and in the conduction state during a transfer period in which the control signal TG is at a high (H) level, to transfer to the floating diffusion FD the charges (electrons) produced by the photoelectric conversion and then stored in the photodiode PD.

The reset transistor RST-Tr is connected between a power supply line VRst and the floating diffusion FD and controlled through a control line RST. It is also possible that the reset transistor RST-Tr is connected between the power supply line VDD and the floating diffusion FD and controlled through the control line RST. The reset transistor RST-Tr remains selected and in the conduction state during a period in which the control signal RST is at the H level, to reset the floating diffusion FD to the potential of the power supply line VRst (or VDD).

The source follower transistor SF-Tr and the selection transistor SEL-Tr are connected in series between the power supply line VDD and a vertical signal line LSGN. The gate of the source follower transistor SF-Tr is connected to the floating diffusion FD, and the selection transistor SEL-Tr is controlled through a control signal SEL. The selection transistor SEL-Tr remains selected and in the conduction state during a period in which the control signal SEL is at the H level. In this way, the source follower transistor SF-Tr outputs, to the vertical signal line LSGN, a read-out signal VSL of a column output obtained by converting the charges in the floating diffusion FD into a voltage signal with a gain corresponding to the quantity of the charges (potential). These operations are performed simultaneously and in parallel for pixels in each row since, for example, the gates of the transfer transistor TG-Tr, the reset transistor RST-Tr, and the selection transistor SEL-Tr in each row are connected to each other.

Since the pixel part 20 includes the pixels PXL arranged in N rows and M columns, there are N control lines for each of the control signals SEL, RST and TG, and M vertical signal lines LSGN. In FIG. 8, the control lines for each row are represented as one row-scanning control line.

The vertical scanning circuit 30 drives the pixels in shutter rows and reading rows through the row-scanning control lines in accordance with the control of the timing control circuit 60. Further, the vertical scanning circuit 30 outputs, according to address signals, row selection signals indicating the row addresses of the reading row from which signals are to be read out and the shutter row in which the charges stored in the photodiodes PD are to be reset.

As described above, in a normal pixel reading operation, the vertical scanning circuit 30 drives the pixels in such a manner that shutter scan is followed by reading scan.

Figure 10A:
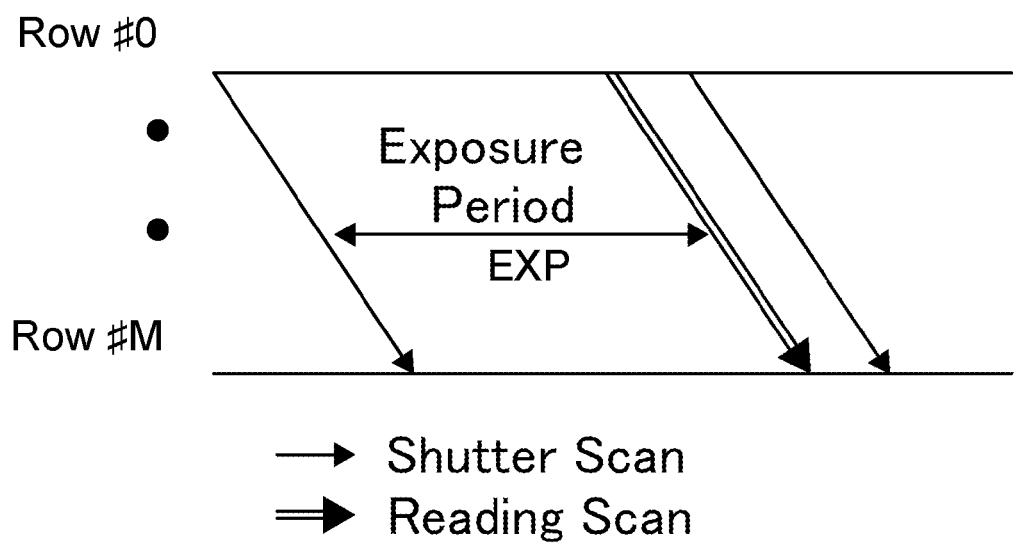
FIGS. 10A and 10B show operation timings of a shutter scan and a reading scan in a normal pixel reading operation according to the embodiment.
Figure 10B:
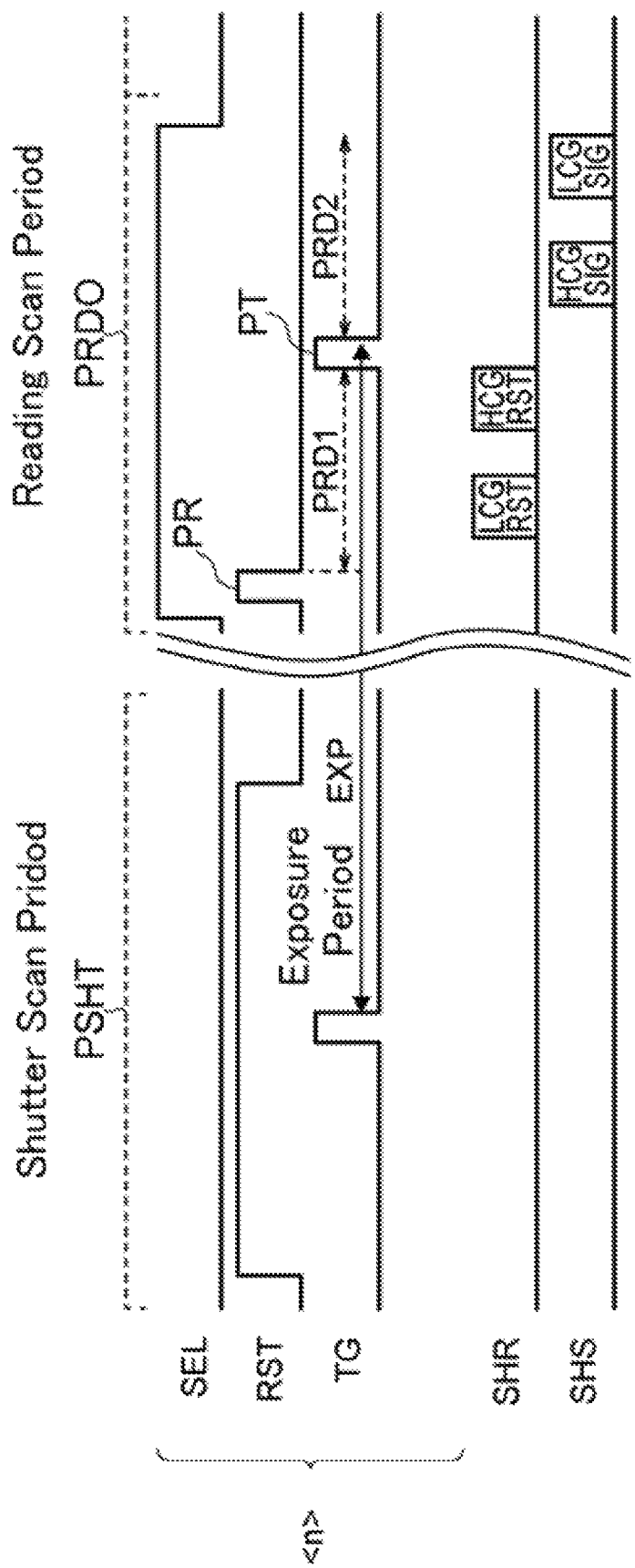

FIGS. 10A and 10B show operation timings of a shutter scan and a reading scan in a normal pixel reading operation according to the embodiment.

The control signal SEL, which controls the ON (conduction) state and the OFF (non-conduction) state of the selection transistor SEL-Tr, remains at the L level during a shutter scan period PSHT to retain the selection transistor SEL-Tr in the non-conduction state, and the control signal SEL remains at the H level during a reading scan period PRD0 to retain the selection transistor SEL Tr in the conduction state. In the shutter scan period PSHT, the control signal TG is set at the H level for a predetermined period within the period in which the control signal RST is at the H level, such that the photodiode PD and the floating diffusion FD are reset through the reset transistor RST-Tr and the transfer transistor TG-Tr.

In the reading scan period PRD0, the control signal RST is set at the H level for a predetermined period, or a reset period PR, to reset the floating diffusion FD through the reset transistor RST-Tr, and a signal in a reset state is read out in a reading period PRD1 after the reset period PR. As shown in FIG. 10B, a read-out reset signal (LCGRST) is read out by the first conversion gain mode reading (LCG), and a read-out reset signal (HCGRST) is read out by the second conversion gain mode reading (HCG). After the reading period PRD1, the control signal TG is set at the H level for a predetermined period, or a transfer period PT, to transfer the stored charges in the photodiode PD to the floating diffusion FD through the transfer transistor TG-Tr, and a signal corresponding to the stored electrons (charges) is read out during a reading period PRD2 after the transfer period PT. As shown in FIG. 10B, a read-out signal (HCGSIG) is read out by the second conversion gain mode reading (HCG), and a read-out signal (LCGSIG) is read out by the first conversion gain mode reading (LCG).

In the normal pixel reading operation according to the first embodiment, as shown in the example of FIG. 10B, a storage period (exposure period) EXP spans from the time in the shutter scan period PSHT at which the control signal TG is switched to the L level after the photodiode PD and the floating diffusion FD are reset to the time in the reading scan period PRD0 at which the control signal TG is switched to the L level to terminate the transfer period PT.

The reading circuit 40 includes a plurality of column signal processing parts (not shown) arranged corresponding to the column outputs of the pixel part 20, and the reading circuit 40 may be configured such that the plurality of column signal processing parts can perform column parallel processing.

Figure 11:
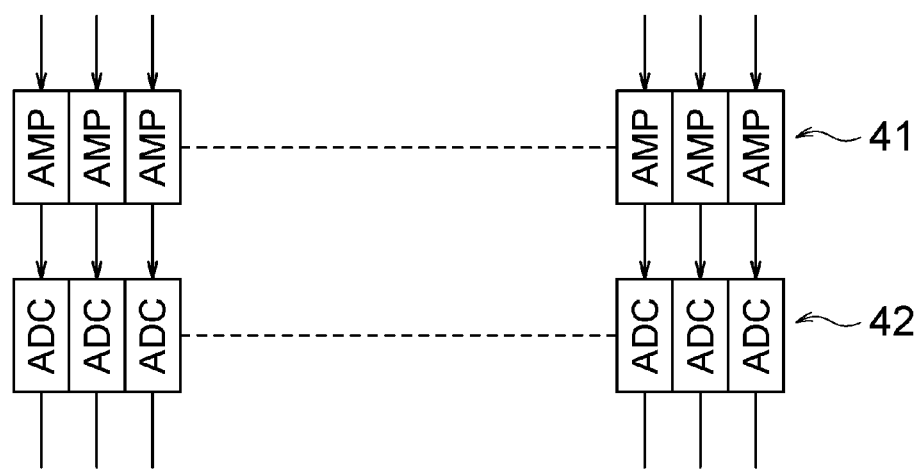
FIG. 11 illustrates an example configuration of a reading system of a column output from a pixel part of the solid-state imaging device according to the embodiment of the present invention.

The reading circuit 40 includes amplifying parts 41 each having an amplifier (AMP) and ADCs 42 as shown in FIG. 11, for example. As will be described in detail later, each of the amplifying parts 41 in the column reading circuit 40 amplifies a plurality of read-out reset signals and a plurality of read-out signals in the uninterrupted pixel signal PSD read out from the pixel, and each of the ADCs 42 in the column reading circuit 40 performs AD conversion to convert the output of the amplifying part 41 from an analog signal to a digital signal.

The horizontal scanning circuit 50 scans the signals processed in the plurality of column signal processing parts, for example, the amplifying parts and the ADCs of the reading circuit 40, transfers the signals in a horizontal direction, and outputs the signals to a signal processing circuit (not shown).

The timing control circuit 60 generates timing signals required for signal processing in the pixel part 20, the vertical scanning circuit 30, the reading circuit 40, the horizontal scanning circuit 50, and the like.

The above description has outlined the configurations and functions of the parts of the solid-state imaging device 10. Next, a description will be hereinafter given of details of configuration of the amplifying parts in the column signal processing parts serving as a column processing system of the reading circuit 40 according to the first embodiment and a reading process related thereto.

Figure 12:
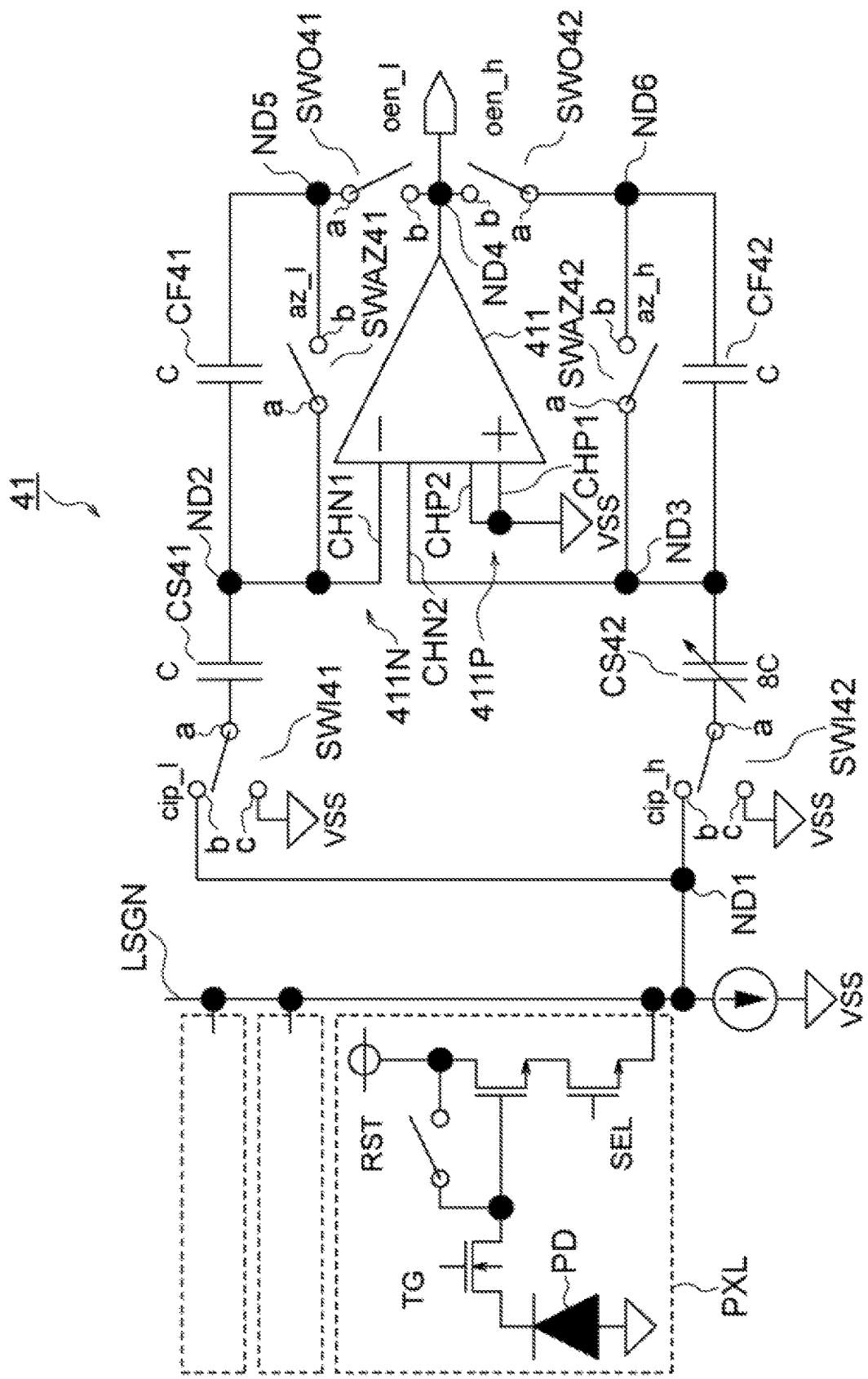
FIG. 12 is a circuit diagram showing an example configuration of an amplifying part according to the first embodiment of the present invention.

FIG. 12 is a circuit diagram showing an example configuration of the amplifying part according to the first embodiment of the present invention.

As shown in FIG. 12, the amplifying part 41 for amplifying a plurality of pixel signals read out from the pixels includes an amplifier 411, a first node ND1 as an input node, a second node ND2, a third node ND3, a fourth node ND4, a fifth node ND5, and a sixth node ND6, a first input switch SWI41, a first sampling capacitor CS41, a second input switch SWI42, a second sampling capacitor CS42, a first feedback capacitor CF41, a first auto-zero switch SWAZ41, a second feedback capacitor CF42, a second auto-zero switch SWAZ42, a first output switch SWO41, and a second output switch SWO42.

The amplifier 411 includes an inverting input terminal (−) 411N and a non-inverting input terminal (+) 411P, and the inverting input terminal (−) 411N has a first inverting input channel CHN1 and a second inverting input channel CHN2. The first inverting input channel CHN1 is connected to the second node ND2, and the second inverting input channel CHN2 is connected to the third node ND3. In the first embodiment, the non-inverting input terminal (+) 411P has a first non-inverting input channel CHP1 and a second non-inverting input channel CHP2. The first non-inverting input channel CHP1 and the second non-inverting input channel CHP2 are connected to a common reference potential.

The first node ND1 is connected to the vertical signal line LSGN, from which a plurality of pixel signals read out from the pixels are input. The fourth node ND4 is connected to an output terminal of the amplifier 411, and the output terminal is connected to an input terminal of the ADC 42. The fifth node ND5 is connected to the fourth node ND4 via the first output switch SWO41. The first output switch SWO41 is retained in the conduction state when the control signal oen_l is at the high level. The sixth node ND6 is connected to the fourth node ND4 via the second output switch SWO42. The second output switch SWO42 is retained in the conduction state when the control signal oen_h is at the high level.

The first input switch SWI41 and the first sampling capacitor CS41 are connected in series between the first node ND1 and the second node ND2. The first input switch SWI41 has a terminal a connected to the first sampling capacitor CS41, a terminal b connected to the first node ND1, and a terminal c connected to the reference potential VSS. In the first input switch SWI41, the terminal a is connected to the terminal b when the control signal cip_l is at the high level, and the terminal a is connected to the terminal c when the control signal cip_l is at the low level, for example.

The second input switch SWI42 and the second sampling capacitor CS42 are connected in series between the first node ND1 and the third node ND3. The second input switch SWI42 has a terminal a connected to the second sampling capacitor CS42, a terminal b connected to the first node ND1, and a terminal c connected to the reference potential VSS. In the second input switch SWI42, the terminal a is connected to the terminal b when the control signal cip_h is at the high level, and the terminal a is connected to the terminal c when the control signal cip_h is at the low level, for example.

The first feedback capacitor CF41 is connected between the second node ND2 and the fifth node ND5. The first auto-zero switch SWAZ41 is connected between the second node ND2 and the fifth node ND5 in parallel with the first feedback capacitor CF41. The second feedback capacitor CF42 is connected between the third node ND3 and the sixth node ND6. The second auto-zero switch SWAZ42 is connected between the third node ND3 and the sixth node ND6 in parallel with the second feedback capacitor CF42.

In the first embodiment, the capacitance of the second sampling capacitor CS42 is larger than that of the first sampling capacitor CS41. In the first embodiment, the capacitance of the second sampling capacitor CS42 is 8C, and the capacitance of the first sampling capacitor CS41 is C. That is, the capacitance of the second sampling capacitor CS42 is eight times as large as that of the first sampling capacitor CS41. In the first embodiment, the capacitance of the first feedback capacitor CF41 and the capacitance of the second feedback capacitor CF42 are C.

Accordingly, in the amplifying part 41, the pixel signals, which are input to the first node ND1, transferred through the first input switch SWI41, the first sampling capacitor CS41, and the second node ND2, and input to the amplifier 411, are read out and amplified by the first conversion gain mode reading (LCG). On the other hand, the pixel signals that are input to the first node ND1, transferred through the second input switch SWI42, the second sampling capacitor CS42, and the third node ND3, and input to the amplifier 411 are read out and amplified by the second conversion gain mode reading (HCG).

Figure 13:
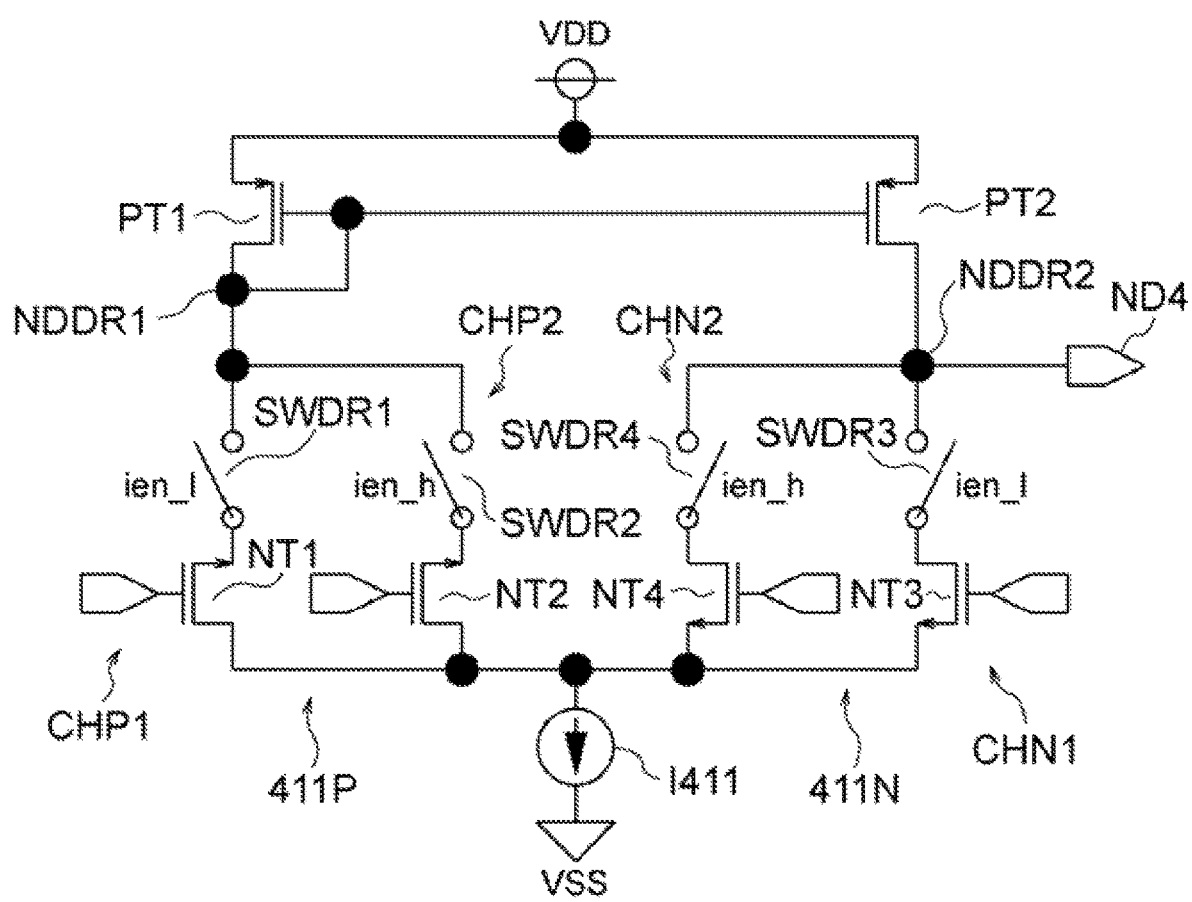
FIG. 13 is a circuit diagram showing an example configuration of an amplifier according to the first embodiment of the present invention.

An example configuration of the amplifier 411 is hereinafter described. FIG. 13 is a circuit diagram showing an example configuration of the amplifier according to the first embodiment of the present invention.

As shown in FIG. 13, the amplifier 411 includes a first drain node NDDR1, a second drain node NDDR2, a first PMOS transistor PT1, and a second PMOS transistor PT2. The second drain node NDDR2 is connected to the fourth node ND4. The first PMOS transistor PT1 has a source connected to the power supply VDD and has a gate and a drain connected to each other at a connection part that is connected to the first drain node NDDR1. The second PMOS transistor PT2 has a source connected to the power supply, a gate connected to a gate and a drain of the first PMOS transistor PT1, and a drain connected to the second drain node NDDR2. The amplifier 411 further includes a current source I411, a two-channel non-inverting input terminal 411P, and a two-channel inverting input terminal 411N. The current source I411 is connected to the reference potential VSS. The two-channel non-inverting input terminal 411P is connected between the first drain node NDDR1 and the current source I411 and includes a first non-inverting input channel CHP1 and a second non-inverting input channel CHP2. The two-channel inverting input terminal 411N is connected between the second drain node NDDR2 and the current source I411 and includes a first inverting input channel CHN1 and a second inverting input channel CHN2.

The first non-inverting input channel CHP1 includes a first NMOS transistor NT1 and a first drain switch SWDR1 connected in series between the first drain node NDDR1 and the current source I411. The second non-inverting input channel CHP2 includes a second NMOS transistor NT2 and a second drain switch SWDR2 connected in series between the first drain node NDDR1 and the current source I411. The first inverting input channel CHN1 includes a third NMOS transistor NT3 and a third drain switch SWDR3 connected in series between the second drain node NDDR2 and the current source I411. The second inverting input channel CHN2 includes a fourth NMOS transistor NT4 and a fourth drain switch SWDR4 connected in series between the second drain node NDDR2 and the current source I411.

The first drain switch SWDR1 and the third drain switch SWDR3 are controlled into the conduction state or the non-conduction state in phase with the first input switch SWI41 and the first output switch SWO41. The first drain switch SWDR1 and the third drain switch SWDR3 are controlled into the conduction state or the non-conduction state by a control signal ien_l. The second drain switch SWDR2 and the fourth drain switch SWDR4 are controlled into the conduction state or the non-conduction state in phase with the second input switch SWI42 and the second output switch SWO42. The second drain switch SWDR2 and the fourth drain switch SWDR4 are controlled into the conduction state or the non-conduction state by a control signal ien_h.

The gate of the first NMOS transistor NT1 and the gate of the second NMOS transistor NT2 are connected to the reference potential VSS, the gate of the third NMOS transistor NT3 is connected to the second node ND2, and the gate of the fourth NMOS transistor NT4 is connected to the third node ND3.

In the amplifier 411 configured as described above, the two-channel non-inverting input terminal 411P and the two-channel inverting input terminal 411N are both connected to the power supply, the PMOS transistors PT1, PT2 as the loads, and the current source I411. Therefore, the amplifier 411 can be formed only by adding, to an ordinary differential amplifier, drain switches and NMOS switches for preventing the memory effect, making it possible to suppress increase of the circuit area.

A variation of the amplifier of FIG. 13 will now be described.

Figure 14:
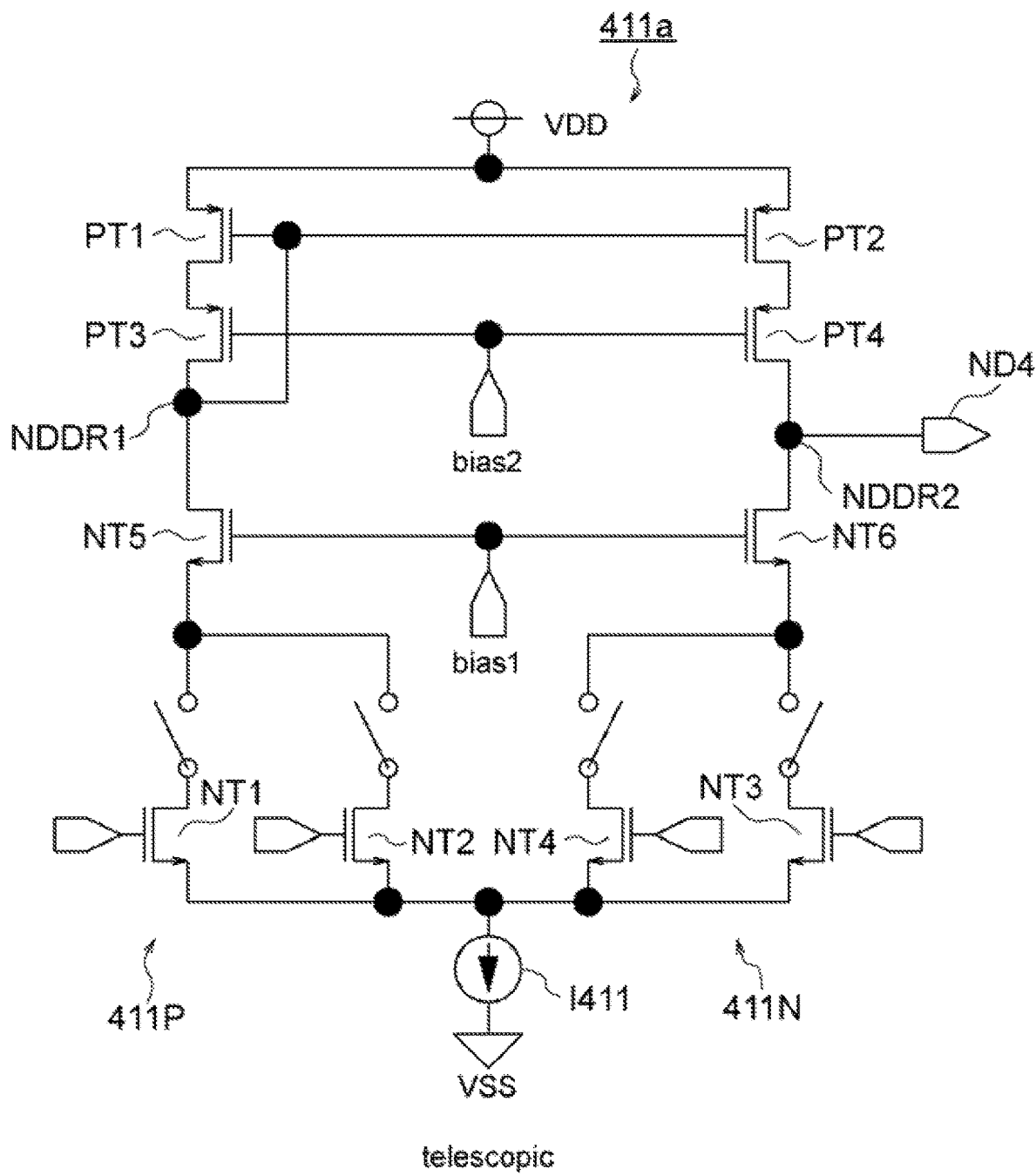
FIG. 14 shows a telescopic amplifier as a first variation of the amplifier of FIG. 13 according to the embodiment.

FIG. 14 shows a telescopic amplifier as a first variation of the amplifier of FIG. 13 according to the embodiment.

The amplifier 411a of FIG. 14 as the first variation is formed as a telescopic amplifier. In the amplifier 411a, a PMOS transistor PT3 is connected between the drain of the PMOS transistor PT1 and the first drain node NDDR1, and a PMOS transistor PT4 is connected between the drain of the PMOS transistor PT2 and the second drain node NDDR2. The gate of the PMOS transistor PT3 and the gate of the PMOS transistor PT4 are connected to a bias potential bias2. An NMOS transistor NT5 is connected between the first drain node NDDR1 and a low impedance side node of the non-inverting input terminal 411P, and an NMOS transistor NT6 is connected between the second drain node NDDR2 and a low impedance side node of the inverting input terminal 411N. The gate of the NMOS transistor NT5 and the gate of the NMOS transistor NT6 are connected to a bias potential bias1.

Figure 15:
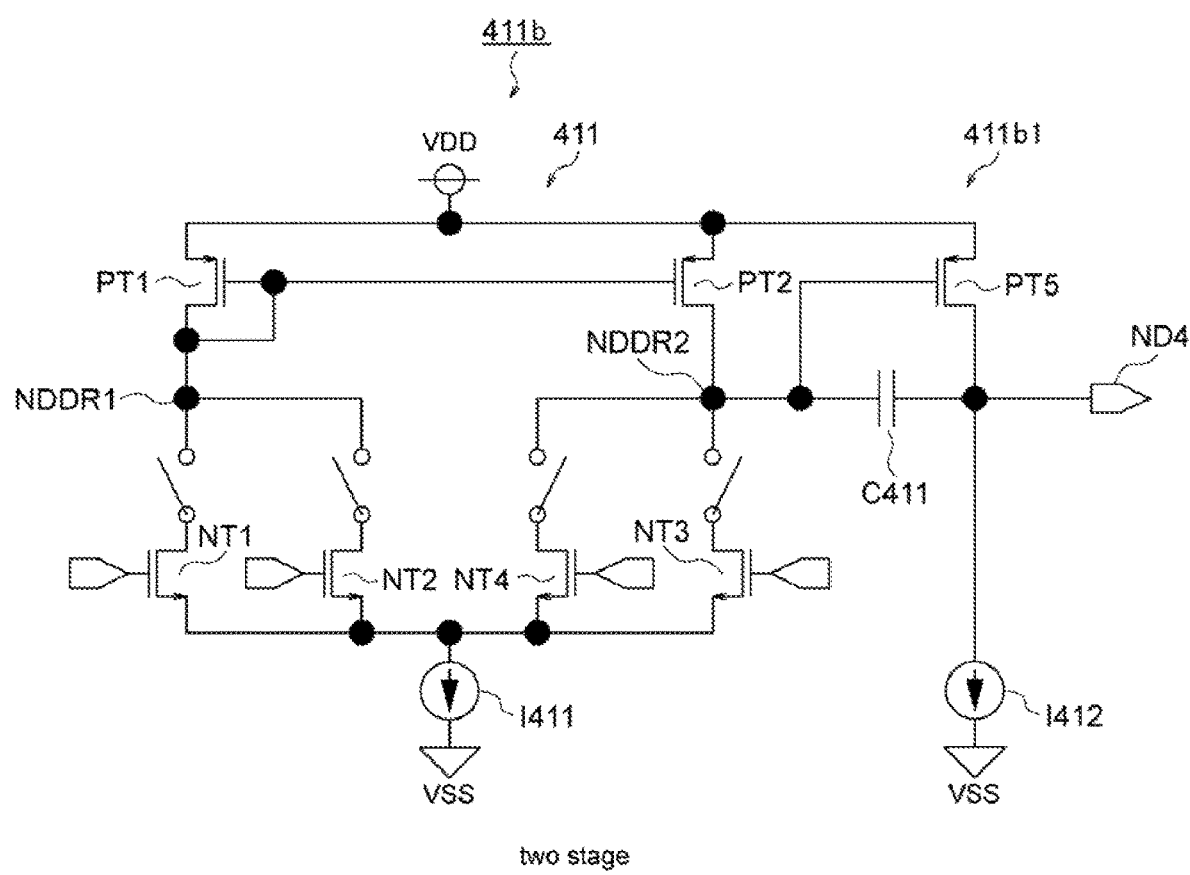
FIG. 15 shows a two-stage amplifier as a second variation of the amplifier of FIG. 13 according to the embodiment

FIG. 15 shows a two-stage amplifier as a second variation of the amplifier of FIG. 13 according to the embodiment The amplifier 411b of FIG. 15 as the second variation is formed as a two-stage amplifier. The amplifier 411 of FIG. 13 is disposed at the first stage, and an output amplifier 411b1 is disposed at the second stage. The output amplifier 411b1 includes a PMOS transistor PT5, a capacitor C411, and a current source I412.

Figure 16:
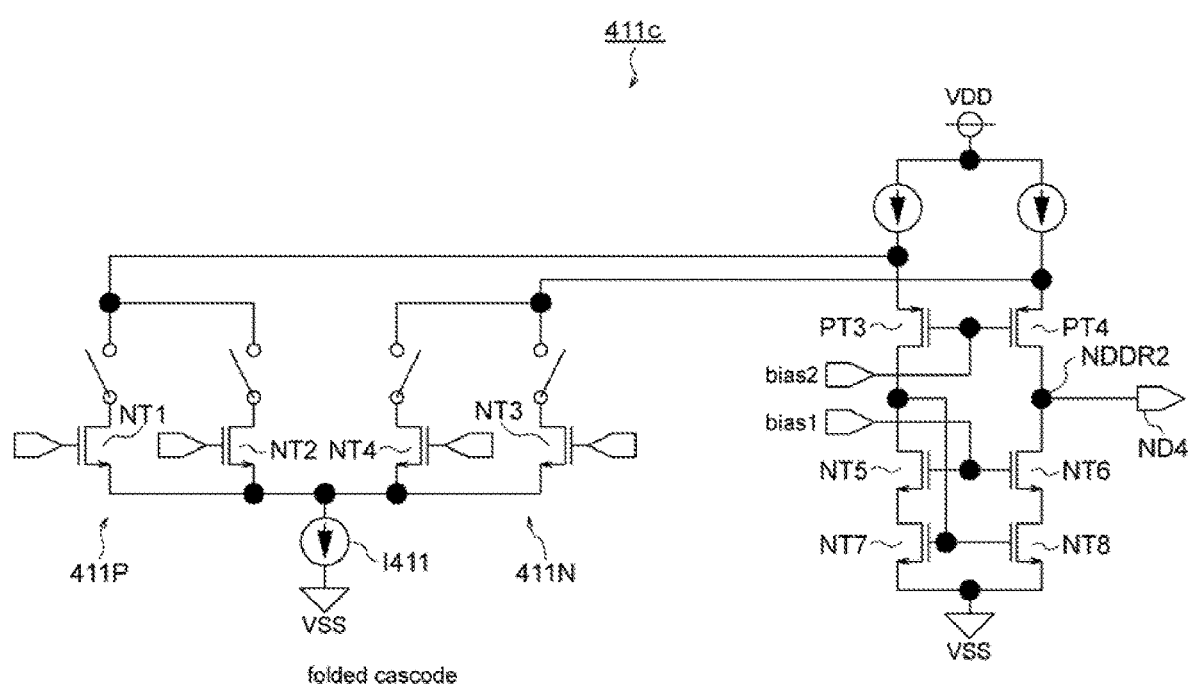
FIG. 16 shows a folded cascode amplifier as a third variation of the amplifier of FIG. 13 according to the embodiment.

FIG. 16 shows a folded cascode amplifier as a third variation of the amplifier of FIG. 13 according to the embodiment.

The amplifier 411c of FIG. 16 as the third variation is formed as a folded cascode amplifier. The amplifier 411c is basically formed from the amplifier of FIG. 14 by converting the connection form from the telescopic type to the folded cascode type. This is not described in detail.

<Reading Operation of Solid-State Imaging Device 10>

The above describes the characteristic configurations and functions of the parts of the solid-state imaging device 10. Next, a detailed description will be given of the reading operation of the pixel signal in the solid-state-imaging device 10 relating to the first embodiment.

Figure 17:
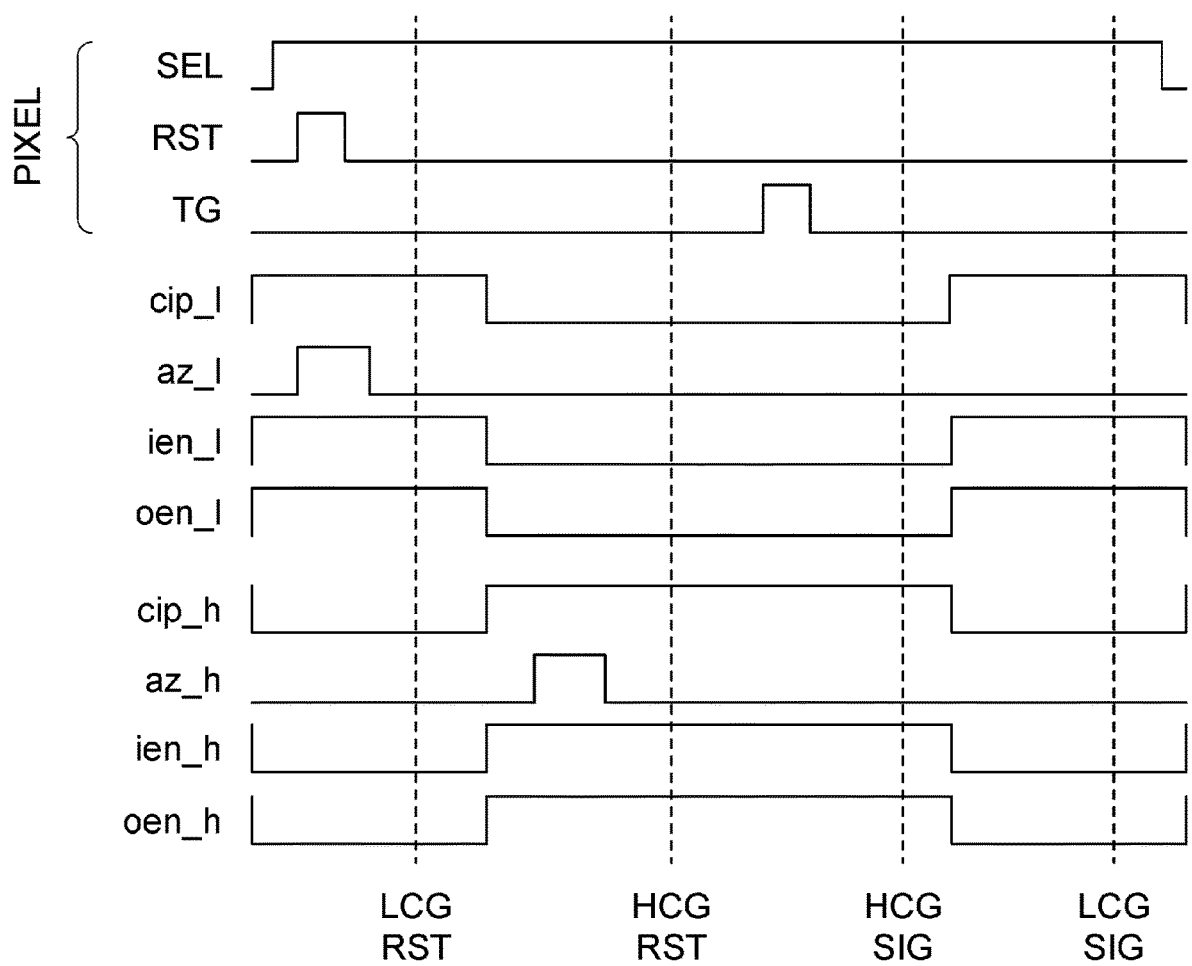
FIG. 17 is a timing chart to illustrate a reading operation of a pixel signal performed by the solid-state imaging device relating to the first embodiment of the present invention.

FIG. 17 is a timing chart to illustrate a reading operation of a pixel signal performed by the solid-state imaging device 10 relating to the first embodiment of the present invention.

The reading operation is performed as follows under the control of the timing control circuit 60. The control signal SEL, which controls the ON (conduction) state and the OFF (non-conduction) state of the selection transistor SEL-Tr, remains at the H level during a reading scan period PRD0 to retain the selection transistor SEL Tr in the conduction state.

At this time, the control signals cip_l, ien_l, oen_l are set at the high level. Thus, the first input switch SWI41 and the first output switch SWO41 of the amplifying part 41 and the first drain switch SWDR1 and the third drain switch SWDR3 of the amplifier 411 are retained in the conduction state. On the other hand, the control signals cip_h, ien_h, oen_h are set at the low level. Thus, the second input switch SWI42 and the second output switch SWO42 of the amplifying part 41 and the second drain switch SWDR2 and the fourth drain switch SWDR4 of the amplifier 411 are retained in the non-conduction state.

In the reading scan period PRD0, the control signal RST is set at the H level to reset the floating diffusion FD through the reset transistor RST-Tr. In parallel to the reset period PR, the control signal az_l is set at the high level for a predetermined period to retain the first auto-zero switch SWAZ41 of the amplifying part 41 in the conduction state for the predetermined period and thus initialize the amplifier 411. A signal in a reset state is read out in the first reading period PRD1 after the reset period PR.

That is, in the first reading period PRD1 after the reset period PR, the first input switch SWI41 and the first output switch SWO41 of the amplifying part 41 and the first drain switch SWDR1 and the third drain switch SWDR3 of the amplifier 411 are retained in the conduction state for a predetermined period, and a first reset signal (LCGRST) is read out and amplified by the first conversion gain mode reading (LCG). The first reset signal LCGRST includes reset noise occurring when the control signal az_l is set at the low level and the first auto-zero switch SWAZ41 is turned into the OFF state.

After the first reset signal (LCGRST) is read out and amplified, the control signals cip_l, ien_l, oen_l are switched to the low level. Thus, the first input switch SWI41 and the first output switch SWO41 of the amplifying part 41 and the first drain switch SWDR1 and the third drain switch SWDR3 of the amplifier 411 are switched to the non-conduction state. On the other hand, the control signals cip_h, ien_h, oen_h are switched to the high level. Thus, the second input switch SWI42 and the second output switch SWO42 of the amplifying part 41 and the second drain switch SWDR2 and the fourth drain switch SWDR4 of the amplifier 411 are switched to the conduction state.

In parallel to the above operation, the control signal az_h is set at the high level for a predetermined period to retain the second auto-zero switch SWAZ42 of the amplifying part 41 in the conduction state for the predetermined period and thus initialize the amplifier 411. That is, after the initialization by the second auto-zero switch SWAZ42, the second input switch SWI42 and the second output switch SWO42 of the amplifying part 41 and the second drain switch SWDR2 and the fourth drain switch SWDR4 of the amplifier 411 are retained in the conduction state for a predetermined period, and a second reset signal (HCGRST) is read out and amplified by the second conversion gain mode reading (HCG). The second reset signal HCGRST includes reset noise occurring when the control signal az_h is set at the low level and the second auto-zero switch SWAZ42 is turned into the OFF state.

After the reading period PRD1, the control signal TG is set at the H level for a predetermined period, or a transfer period PT, to transfer the stored charges in the photodiode PD to the floating diffusion FD through the transfer transistor TG-Tr, and a signal corresponding to the stored electrons (charges) is read out during a reading period PRD2 after the transfer period PT.

That is, in the second reading period PRD2 after the transfer period PT, the second input switch SWI42 and the second output switch SWO42 of the amplifying part 41 and the second drain switch SWDR2 and the fourth drain switch SWDR4 of the amplifier 411 are retained in the conduction state, and a second reading signal (HCGSIG) is read out and amplified by the second conversion gain mode reading (HCG). The second reading signal HCGSIG includes reset noise occurring when the control signal az_h is set at the low level and the second auto-zero switch SWAZ42 is turned into the OFF state, the reset noise being stored as electrons at the node ND3. The reset noise occurring when the control signal az_h is set at the low level and the second auto-zero switch SWAZ42 is turned into the OFF state can be removed by CDS in a circuit at a later stage, in which a difference between the second reading signal HCGSIG and the second reset signal HCGRST is calculated.

After the second reset signal (HCGSIG) is read out and amplified, the control signals cip_l, ien_l, oen_l are switched to the high level. Thus, the first input switch SWI41 and the first output switch SWO41 of the amplifying part 41 and the first drain switch SWDR1 and the third drain switch SWDR3 of the amplifier 411 are switched to the conduction state. On the other hand, the control signals cip_h, ien_h, oen_h are switched to the low level. Thus, the second input switch SWI42 and the second output switch SWO42 of the amplifying part 41 and the second drain switch SWDR2 and the fourth drain switch SWDR4 of the amplifier 411 are switched to the non-conduction state.

After the second input switch SWI42 and the second output switch SWO42 of the amplifying part 41 and the second drain switch SWDR2 and the fourth drain switch SWDR4 of the amplifier 411 are switched to the non-conduction state, a first reading signal (LCGSIG) is read out and amplified by the first conversion gain mode reading (LCG). The first reading signal LCGSIG includes reset noise occurring when the control signal az_l is set at the low level and the first auto-zero switch SWAZ41 is turned into the OFF state, the reset noise being stored as electrons at the node ND2. The reset noise occurring when the control signal az_l is set at the low level and the first auto-zero switch SWAZ41 is turned into the OFF state can be removed by CDS in a circuit at a later stage, in which a difference between the first reading signal LCGSIG and the first reset signal LCGRST is calculated.

As described above, according to the first embodiment, the amplifying part 41 for amplifying a plurality of pixel signals read out from the pixels includes the amplifier 411, the first node ND1 as an input node, the second node ND2, the third node ND3, the fourth node ND4, the fifth node ND5, and the sixth node ND6, the first input switch SWI41, the first sampling capacitor CS41, the second input switch SWI42, the second sampling capacitor CS42, the first feedback capacitor CF41, the first auto-zero switch SWAZ41, the second feedback capacitor CF42, a second auto-zero switch SWAZ42, a first output switch SWO41, and a second output switch SWO42. The amplifier 411 includes the inverting input terminal (−) 411N and the non-inverting input terminal (+) 411P, and the inverting input terminal (−) 411N has the first inverting input channel CHN1 and the second inverting input channel CHN2. The first inverting input channel CHN1 is connected to the second node ND2, and the second inverting input channel CHN2 is connected to the third node ND3. In the first embodiment, the non-inverting input terminal (+) 411P has the first non-inverting input channel CHP1 and the second non-inverting input channel CHP2. The first non-inverting input channel CHP1 and the second non-inverting input channel CHP2 are connected to the common reference potential. In the first embodiment, the capacitance of the second sampling capacitor CS42 is 8C, and the capacitance of the first sampling capacitor CS41 is C. That is, the capacitance of the second sampling capacitor CS42 is eight times as large as that of the first sampling capacitor CS41.

With the first embodiment, it is possible to remove a noise gap at a connection point between the low conversion gain data and the high conversion gain data, suppress increase of power consumption and circuit areas, provide a wide dynamic range, and thus achieve high image quality.

Second Embodiment

Figure 18:
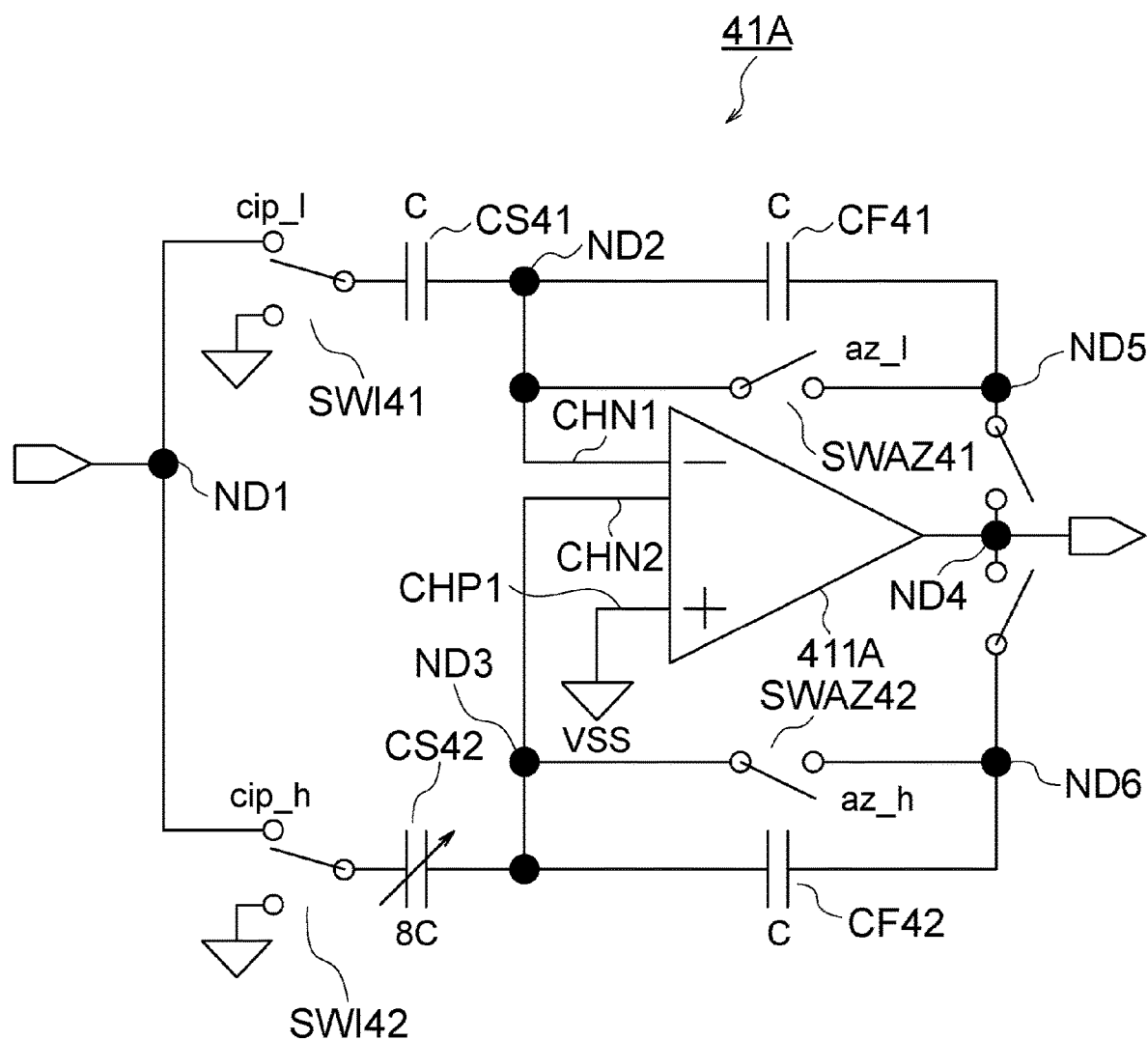
FIG. 18 is a circuit diagram showing an example configuration of the amplifying part according to a second embodiment of the present invention.
Figure 19:
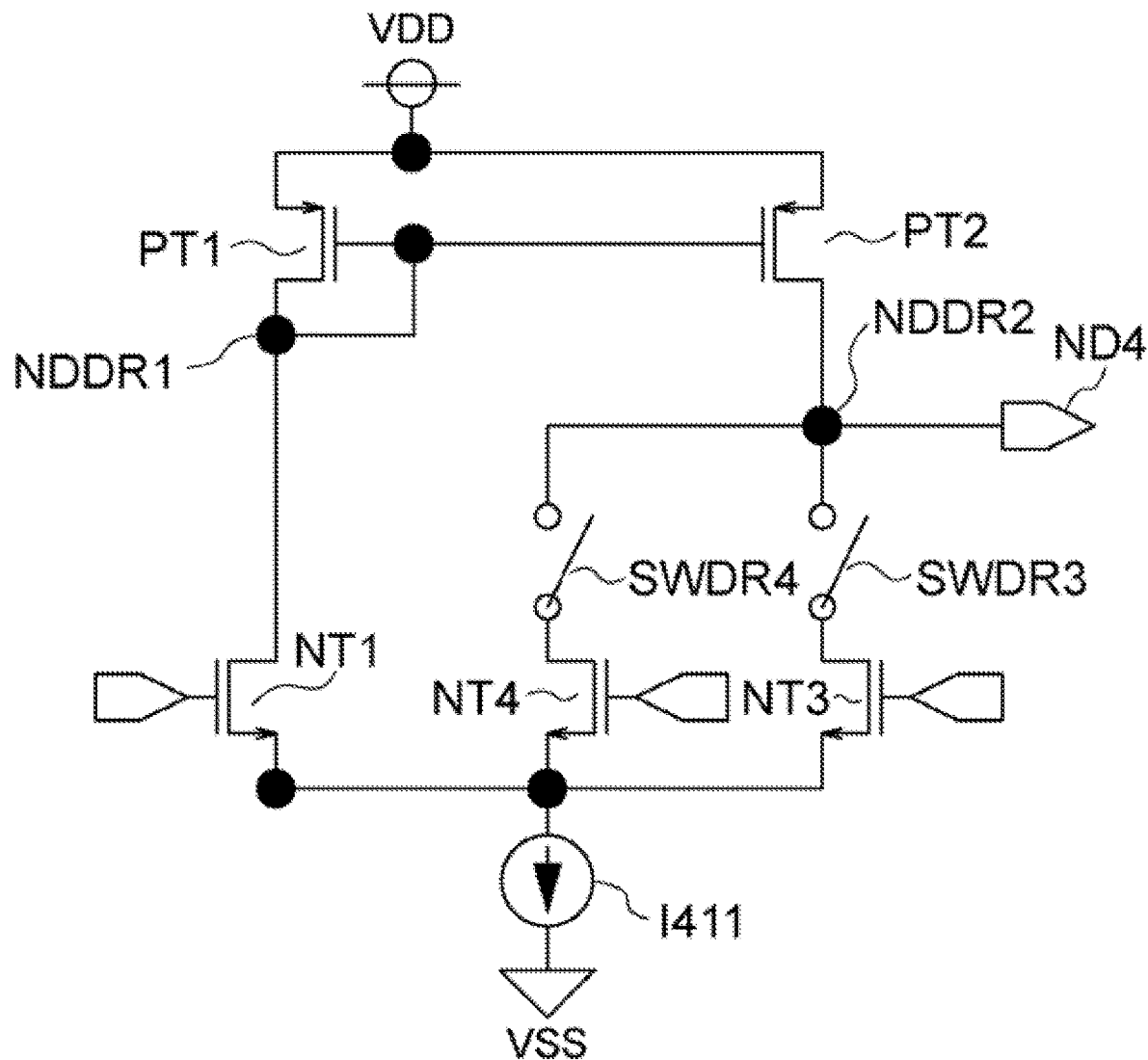
FIG. 19 is a circuit diagram showing an example configuration of the amplifier according to the second embodiment of the present invention.

FIG. 18 is a circuit diagram showing an example configuration of the amplifying part according to the second embodiment of the present invention. FIG. 19 is a circuit diagram showing an example configuration of the amplifier according to the second embodiment of the present invention.

The amplifying part 41A of the second embodiment differs from the amplifying part 41 of the first embodiment in the following points. In the amplifying part 41A of the second embodiment, the non-inverting input terminal (+) 411P of the amplifier 411A has one channel, instead of two channels. Therefore, the amplifier 411A does not include the drain switches SWDR1, SWDR2 and the NMOS transistor NT2 since these are unnecessary.

The second embodiment makes it possible not only to produce the same effects as the above-described first embodiment but also to further suppress the increase of power consumption and circuit areas.

Third Embodiment

Figure 20:
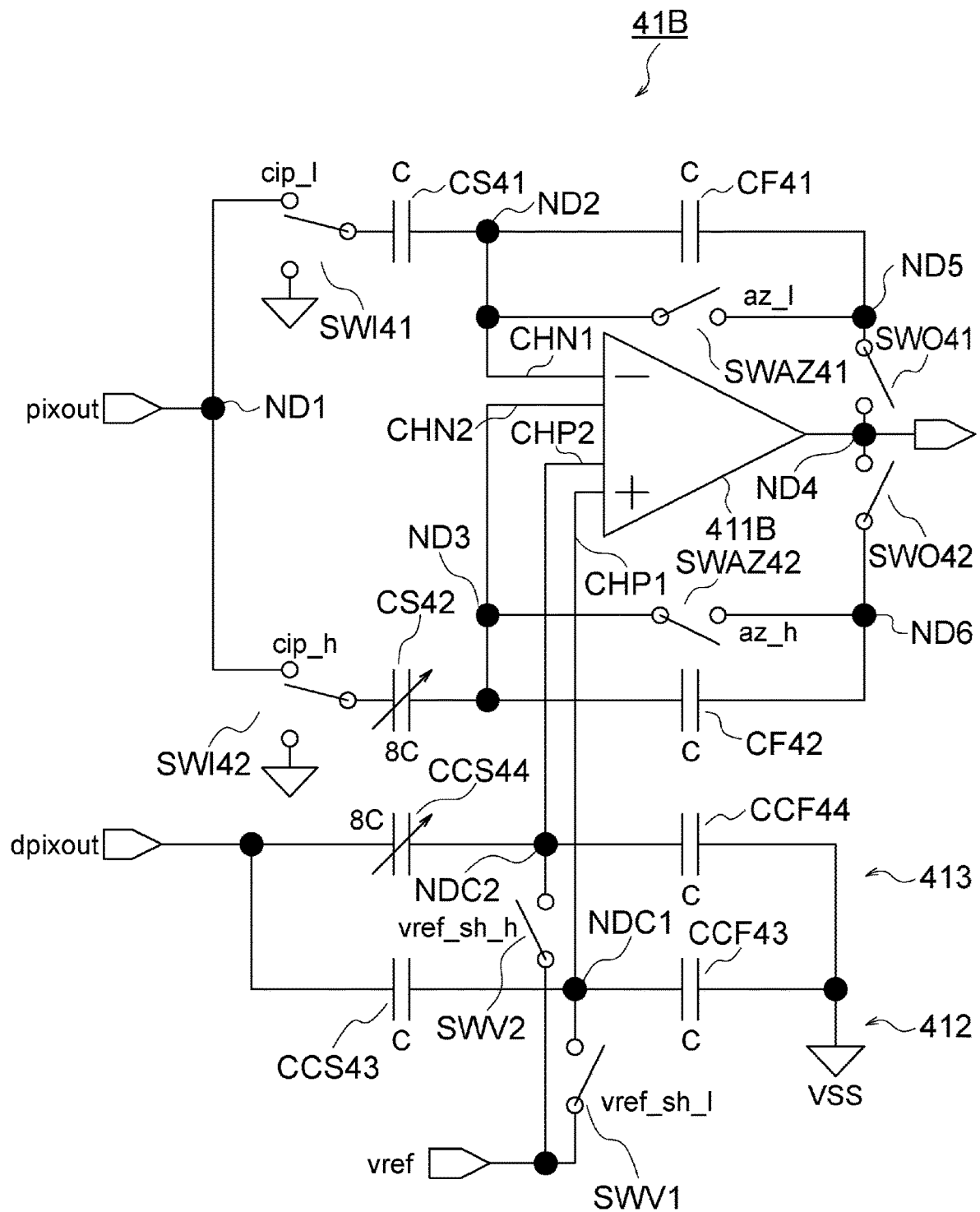
FIG. 20 is a circuit diagram showing an example configuration of the amplifying part according to a third embodiment of the present invention.
Figure 21:
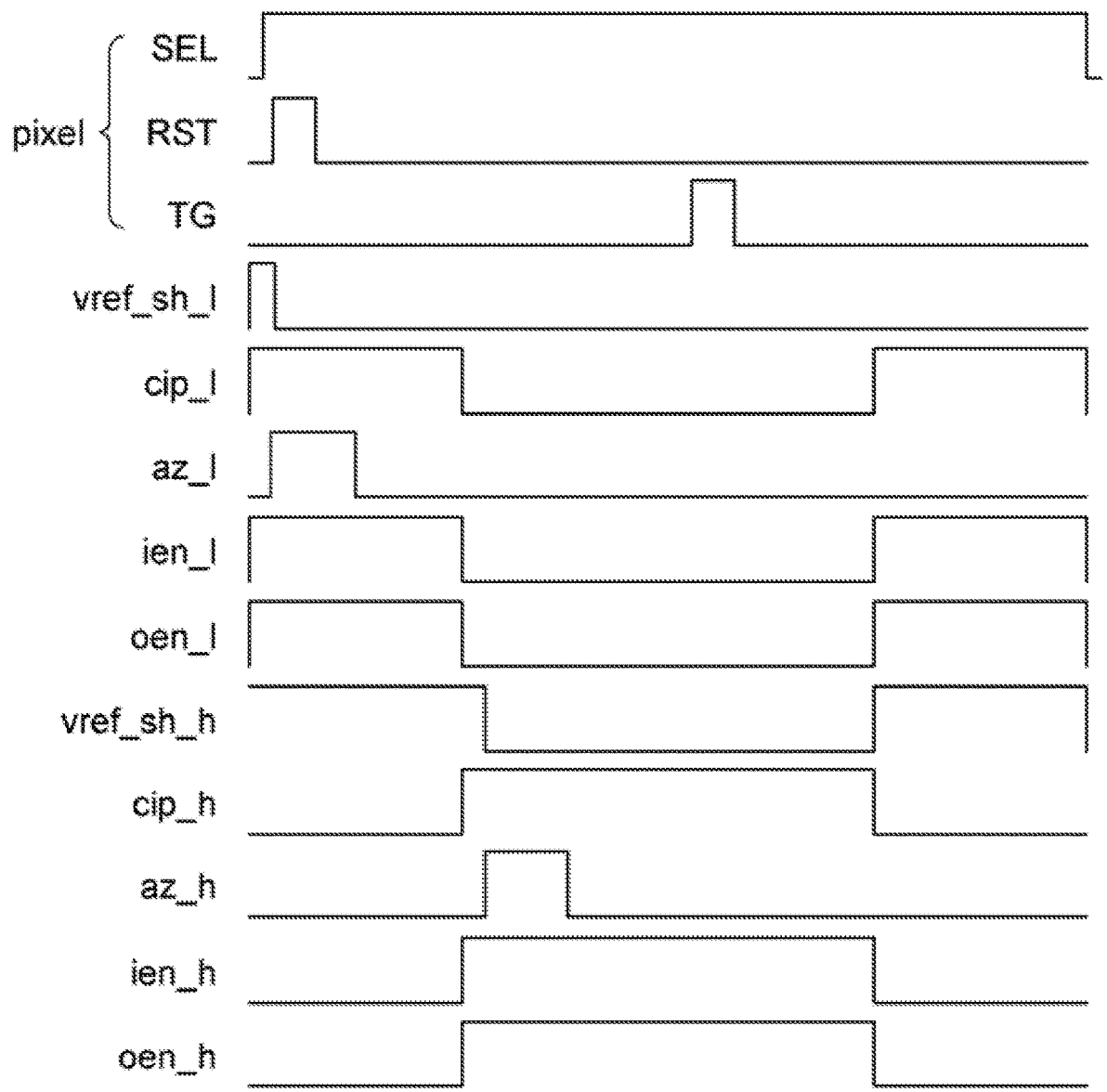
FIG. 21 is a timing chart of a reading operation of a pixel signal performed by the solid-state imaging device relating to the third embodiment of the present invention.

FIG. 20 is a circuit diagram showing an example configuration of the amplifying part according to the third embodiment of the present invention. FIG. 21 is a timing chart of a reading operation of a pixel signal performed by the solid-state imaging device relating to the third embodiment of the present invention.

The amplifying part 41B of the third embodiment differs from the amplifying part 41 of the first embodiment in the following points. In the amplifying part 41B of the third embodiment, the two channels of the non-inverting input terminal (+) 411P of the amplifier 411 are connected to pixel ground noise cancelling circuits 412, 413, respectively.

The pixel ground noise cancelling circuit 412 includes: a channel node NDC1 connected to the first channel CHP1 of the non-inverting input terminal (+) 411P; a sampling capacitor CCS43 connected between a signal input line and the channel node NDC1; a feedback capacitor CCF43 connected between the channel node NDC1 and the reference potential VSS; and a switch SWV1 for selectively connecting between the channel node NDC1 and the reference potential Vref in accordance with the control signal vref sh_l. Likewise, the ground noise cancelling circuit 413 includes: a channel node NDC2 connected to the second channel CHP2 of the non-inverting input terminal (+) 411P; a sampling capacitor CCS44 connected between the signal input line and the channel node NDC2; a feedback capacitor CCF44 connected between the channel node NDC2 and the reference potential VSS; and a switch SWV2 for selectively connecting between the channel node NDC2 and the reference potential Vref in accordance with the control signal vref sh_h.

The capacitance C of the sampling capacitor CCS43 of the pixel ground noise cancelling circuit 412 is equal to the capacitance of the first sampling capacitor CS41. The capacitance 8C of the sampling capacitor CCS44 of the pixel ground noise cancelling circuit 413 is equal to the capacitance 8C of the second sampling capacitor CS42.

In the third embodiment, the first conversion gain mode reading (LCG) is performed to read out and amplify the signals, as shown in FIG. 21, with the control signals Vref_sh_l, Vref_sh_h at the high level, the switches SWV1, SWV2 in the conduction state, and the ground bounce cancellation (GBC) disabled. On the other hand, the second conversion gain mode reading (HCG) is performed to read out and amplify the signals, as shown in FIG. 21, with the control signals Vref_sh_l, Vref_sh_h at the low level, the switches SWV1, SWV2 in the non-conduction state, and the ground bounce cancellation (GBC) enabled.

The third embodiment can not only produce the same effects as the above-described first embodiment but also can cancel, for example, the column-wise ground (GND) floating and eventually reduce noise such as shading, since the signals input to the pixel ground noise cancelling circuits 412, 413 are supplied to the non-inverting input terminal (+) 411P of the amplifier 411B of the amplifying part 41B via the sampling capacitors CCS43, CCS44. This configuration provides what is called the ground bounce cancellation (GBC).

Fourth Embodiment

Figure 22:
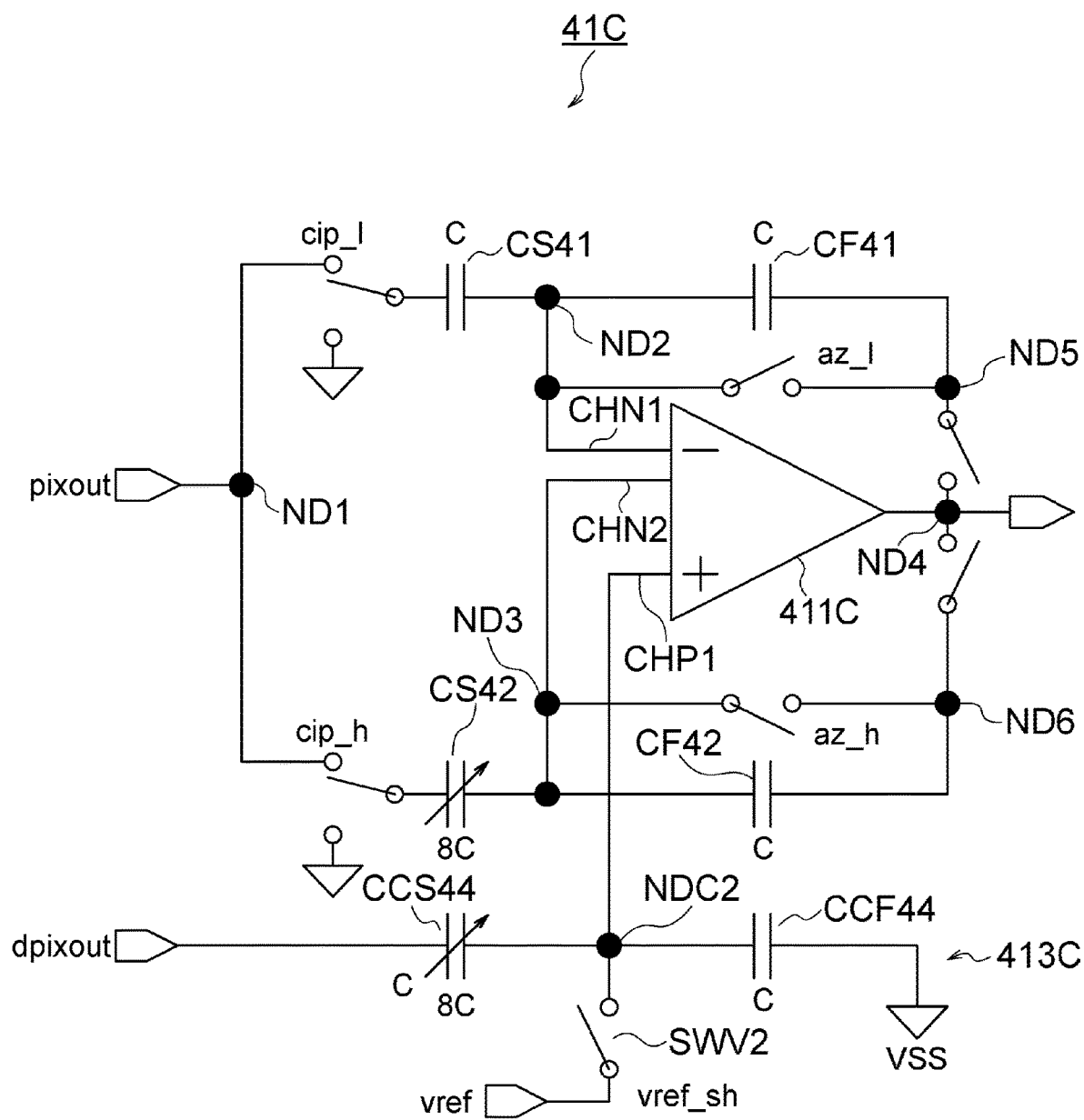
FIG. 22 is a circuit diagram showing an example configuration of the amplifying part according to a fourth embodiment of the present invention.
Figure 23:
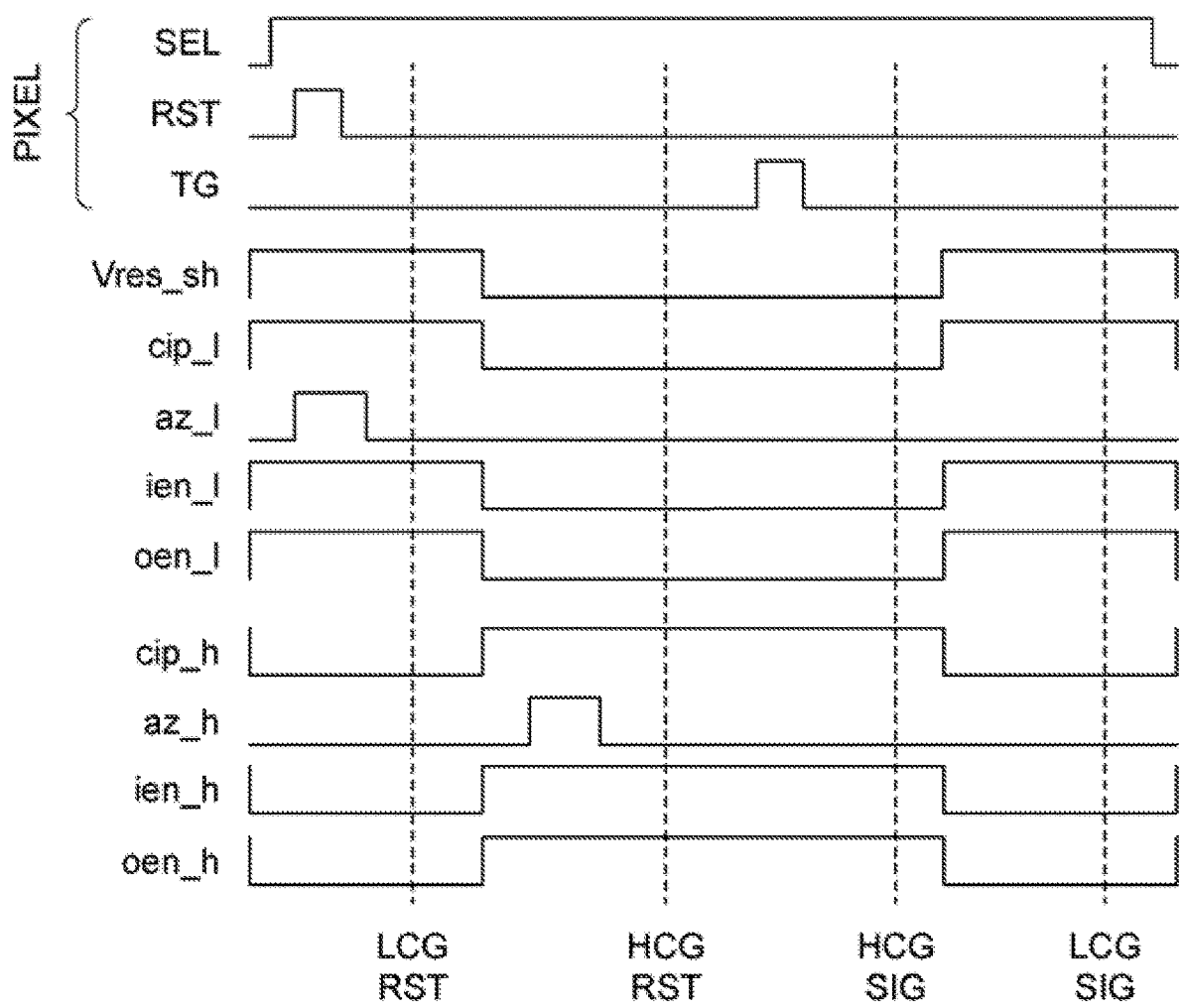
FIG. 23 is a timing chart of a reading operation of a pixel signal performed by the solid-state imaging device relating to the fourth embodiment of the present invention.

FIG. 22 is a circuit diagram showing an example configuration of the amplifying part according to the fourth embodiment of the present invention. FIG. 23 is a timing chart of a reading operation of a pixel signal performed by the solid-state imaging device relating to the fourth embodiment of the present invention.

The amplifying part 41C of the fourth embodiment differs from the amplifying part 41A of the second embodiment in the following points. In the amplifying part 41C of the fourth embodiment, the channel CHP1 of the non-inverting input terminal (+) 411P of the amplifier 411 is connected to a pixel ground noise cancelling circuit 413C.

The ground noise cancelling circuit 413C includes: a channel node NDC2 connected to the channel CHP1 of the non-inverting input terminal (+) 411P; a sampling capacitor CCS44 connected between the signal input line and the channel node NDC2; a feedback capacitor CCF44 connected between the channel node NDC2 and the reference potential VSS; and a switch SWV2 for selectively connecting between the channel node NDC2 and the reference potential Vref.

The capacitance 8C of the sampling capacitor CCS44 of the pixel ground noise cancelling circuit 413C is equal to the capacitance 8C of the second sampling capacitor CS42.

In the fourth embodiment, the first conversion gain mode reading (LCG) is performed to read out and amplify the signals, as shown in FIG. 23, with the control signal Vref_sh at the high level, the switch SWV2 in the conduction state, and the ground bounce cancellation (GBC) disabled. On the other hand, the second conversion gain mode reading (HCG) is performed to read out and amplify the signals, as shown in FIG. 23, with the control signal Vref_sh at the low level, the switch SWV2 in the non-conduction state, and the ground bounce cancellation (GBC) enabled.

The fourth embodiment can not only produce the same effects as the above-described first and second embodiments but also can cancel, for example, the column-wise ground (GND) floating and eventually reduce noise such as shading in low illuminance, since in the second conversion gain mode reading (HCG), the signals input to the pixel ground noise cancelling circuit 413 are supplied to the non-inverting input terminal (+) 411P of the amplifier 411C of the amplifying part 41C via the sampling capacitor CCS44. This configuration provides what is called the ground bounce cancellation (GBC).

Fifth Embodiment

Figure 24:
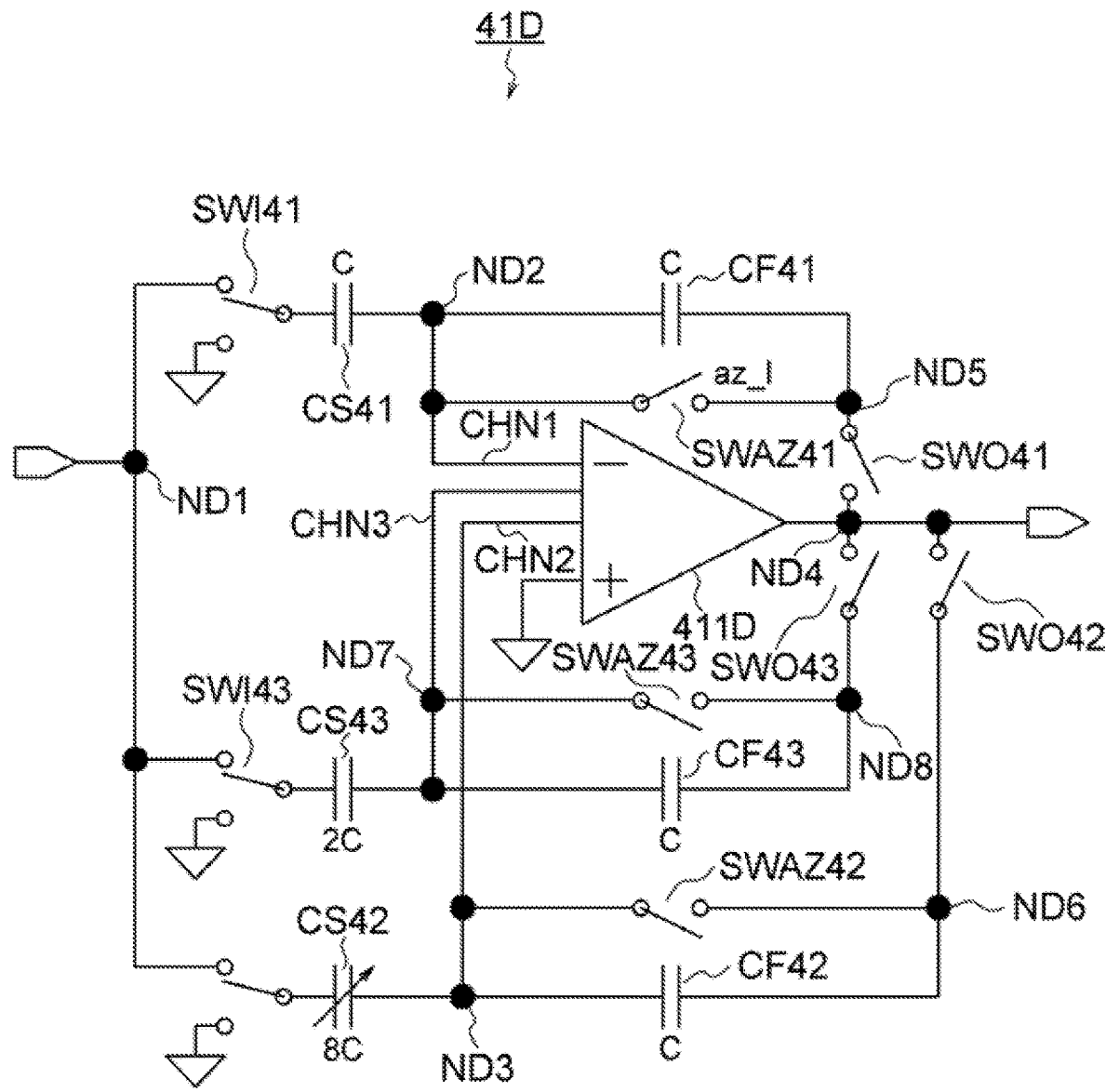
FIG. 24 is a circuit diagram showing an example configuration of the amplifying part according to a fifth embodiment of the present invention.

FIG. 24 is a circuit diagram showing an example configuration of the amplifying part according to the fifth embodiment of the present invention.

The amplifying part 41D of the fifth embodiment differs from the amplifying part 41A of the second embodiment in the following points. In the amplifying part 41D of the fifth embodiment, the inverting input terminal (−) 411N of the amplifier 411D has more than two channels, instead of two channels. In the fifth embodiment, the inverting input terminal (−) 411N of the amplifier 411D has three inverting input channels CHN1, CHN2, CHN3 for three gain combination.

The amplifying part 41D includes: a seventh node ND7 connected to the third inverting input channel CHN3; an eighth node ND8 connected to the fourth node ND4 via a third output switch SWO43; a third input switch SWI43 and a third sampling capacitor CS43 connected in series between the first node ND1 and the seventh node ND7; and a third feedback capacitor CF43 connected between the seventh node ND7 and the eighth node ND8. The amplifying part 41D further includes a third auto-zero switch SWAZ43 connected between the seventh node ND7 and the eighth node ND8 in parallel with the third feedback capacitor CF43. The capacitance 2C of the third sampling capacitor CS43, the capacitance 8C of the second sampling capacitor CS42, and the capacitance C of the first sampling capacitor CS41 are different from one another.

The fifth embodiment makes it possible not only to obtain the same effect as the second embodiment described above, but also to perform the first conversion gain mode reading (LCG) and the second conversion gain mode reading (HCG) with combinations of three gains obtained by three times sampling.

Sixth Embodiment

Figure 25:
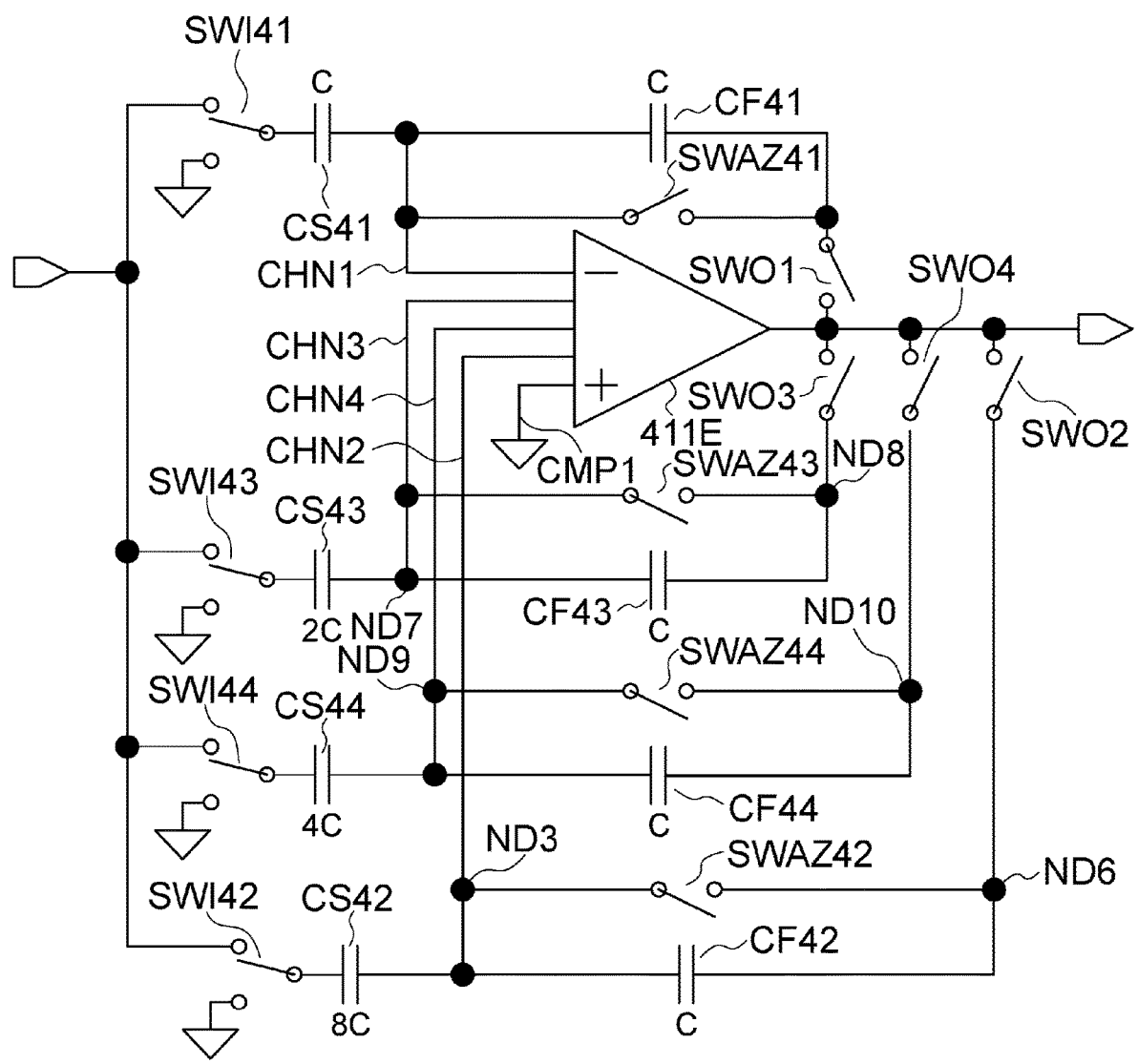
FIG. 25 is a circuit diagram showing an example configuration of the amplifying part according to a sixth embodiment of the present invention.

FIG. 25 is a circuit diagram showing an example configuration of the amplifying part according to the sixth embodiment of the present invention.

The amplifying part 41E of the sixth embodiment differs from the amplifying part 41D of the fifth embodiment in the following points. In the amplifying part 41E of the sixth embodiment, the inverting input terminal (−) 411N of the amplifier 411 has more than two channels, instead of two channels. In the sixth embodiment, the inverting input terminal (−) 411N of the amplifier 411E has four inverting input channels CHN1, CHN2, CHN3, CHN4 for four gain combination.

The amplifying part 41E includes: a ninth node ND9 connected to the fourth inverting input channel CHN4; a tenth node ND10 connected to the fourth node ND4 via a fourth output switch SWO4; a fourth input switch SWI44 and a fourth sampling capacitor CS44 connected in series between the first node ND1 and the ninth node ND9; and a fourth feedback capacitor CF44 connected between the ninth node ND9 and the tenth node ND10. The amplifying part 41E further includes a fourth auto-zero switch SWAZ44 connected between the ninth node ND9 and the tenth node ND10 in parallel with the fourth feedback capacitor CF44. The capacitance 4C of the fourth sampling capacitor CS44, the capacitance 2C of the third sampling capacitor CS43, the capacitance 8C of the second sampling capacitor CS42, and the capacitance C of the first sampling capacitor CS41 are different from one another.

The sixth embodiment makes it possible not only to obtain the same effect as the second and fourth embodiments described above, but also to perform the first conversion gain mode reading (LCG) and the second conversion gain mode reading (HCG) with combinations of four gains obtained by four times sampling.

The solid-state imaging device 10 described above can be applied, as an imaging device, to electronic apparatuses such as digital cameras, video cameras, mobile terminals, surveillance cameras, and medical endoscope cameras.

Figure 26:
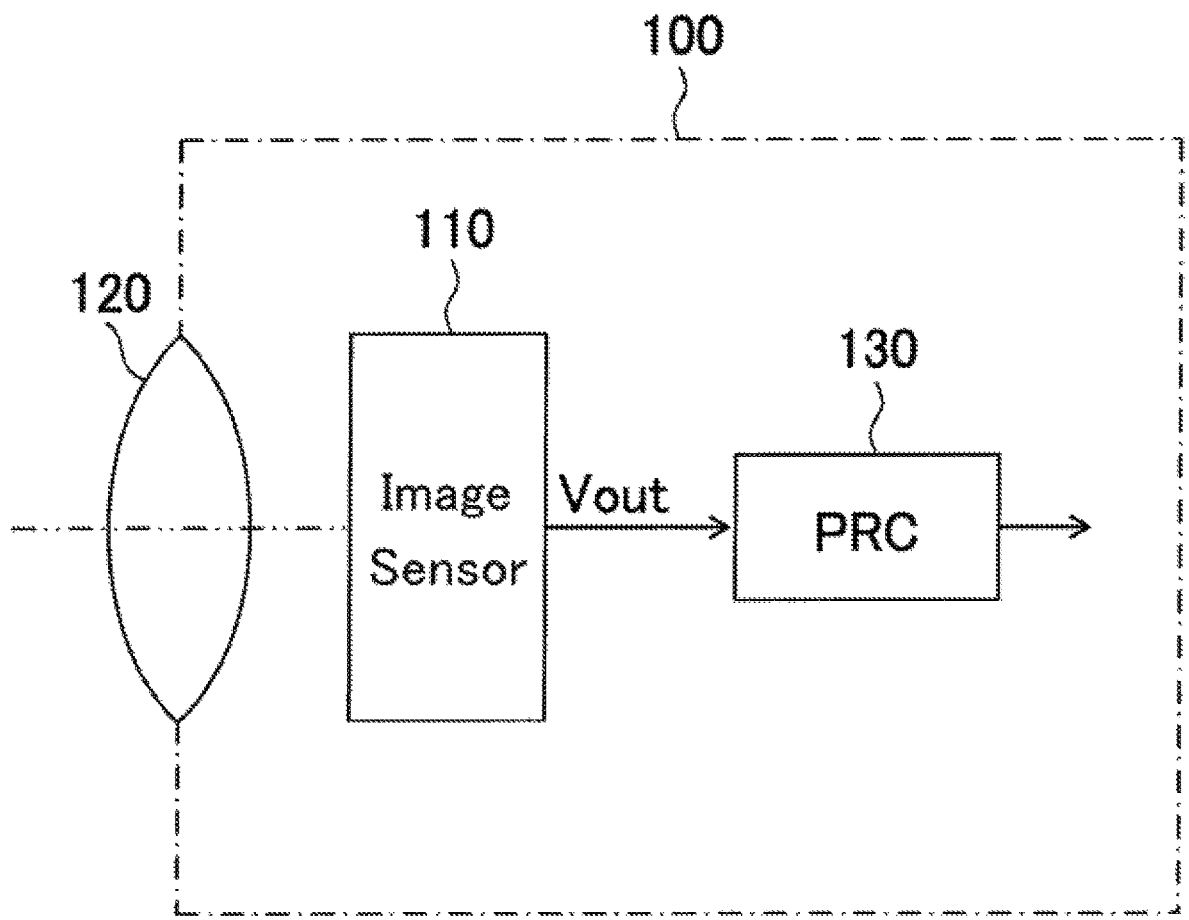
FIG. 26 shows an example configuration of an electronic apparatus to which the solid-state imaging devices relating to the embodiments of the present invention can be applied.

FIG. 26 shows an example configuration of an electronic apparatus including a camera system to which the solid-state imaging device according to the embodiments of the present invention is applied.

As shown in FIG. 26, the electronic apparatus 100 includes a CMOS image sensor 110 that can be constituted by the solid-state imaging device 10 according to the embodiments of the present invention. Further, the electronic apparatus 100 includes an optical system (such as a lens) 120 for redirecting the incident light to pixel regions of the CMOS image sensor 110 (to form a subject image). The electronic apparatus 100 includes a signal processing circuit (PRC) 130 for processing output signals of the CMOS image sensor 110.

The signal processing circuit 130 performs predetermined signal processing on the output signals of the CMOS image sensor 110. The image signals processed in the signal processing circuit 130 can be handled in various manners. For example, the image signals can be displayed as a video image on a monitor having a liquid crystal display, or the image signals can be printed by a printer or recorded directly on a storage medium such as a memory card.

As described above, a high-performance, compact, and low-cost camera system can be provided that includes the solid-state imaging device 10 as the CMOS image sensor 110. Further, it is possible to produce electronic apparatuses such as surveillance cameras and medical endoscope cameras that are used for applications where cameras are required to be installed under restricted conditions such as the installation size, number of connectable cables, cable length, and installation height.

What is claimed is:

1. A solid-state imaging device providing an extended dynamic range by combining a plurality of read-out signals each formed of a signal at a reference level and a signal at a signal level, the solid-state imaging device comprising:
    a pixel part including a pixel arranged therein; and
    a reading part including a column signal processing part arranged so as to correspond to a column output of the pixel part,
    wherein the column signal processing part includes an amplifying part for amplifying the plurality of read-out signals read out from the pixel, and
    wherein the amplifying part includes:
        an amplifier including an inverting input terminal and a non-inverting input terminal, the inverting input terminal having at least a first inverting input channel and a second inverting input channel;
        a first node to which the plurality of read-out signals are input;
        a second node connected to the first inverting input channel;
        a third node connected to the second inverting input channel;
        a fourth node connected to an output terminal of the amplifier;
        a fifth node connected to the fourth node via a first output switch;
        a sixth node connected to the fourth node via a second output switch;
        a first input switch and a first sampling capacitor connected in series between the first node and the second node;
        a second input switch and a second sampling capacitor connected in series between the first node and the third node;
        a first feedback capacitor connected between the second node and the fifth node; and
        a second feedback capacitor connected between the third node and the sixth node.

2. The solid-state imaging device according to claim 1, wherein a capacitance of the second sampling capacitor is larger than that of the first sampling capacitor.

3. The solid-state imaging device according to claim 2, wherein the pixel includes:
    a photoelectric conversion element for storing therein, in a storage period, charges generated by photoelectric conversion;
    a transfer element for transferring, in a transfer period, the charges stored in the photoelectric conversion element;
    a floating diffusion to which the charges stored in the photoelectric conversion element are transferred through the transfer element;
    a source follower element for converting the charges in the floating diffusion into a voltage signal at a level corresponding to the quantity of the charges and outputting the voltage signal to an output node; and
    a reset element for resetting, in a reset period, the floating diffusion to a predetermined potential, and
    wherein the reading part is configured to:
        reset the floating diffusion through the reset element in the reset period;
        read out and amplify, at least in a first reading period after the reset period, a first reset signal by first conversion gain mode reading (LCG), while retaining the first input switch and the first output switch in a conduction state for a predetermined period;

switch, after reading out the first reset signal, the first input switch and the first output switch to a non-conduction state;

switch the second input switch and the second output switch to the conduction state, and read out and amplify a second reset signal by second conversion gain mode reading (HCG);

cause, in a transfer period after the first reading period, the charges stored in the photoelectric conversion element to be transferred to the floating diffusion through the transfer element;

read out and amplify, in a second reading period after the transfer period, a second read-out signal by the second conversion gain mode reading (HCG), while retaining the second input switch and the second output switch in the conduction state; and switch, after reading out the second read-out signal, the second input switch and the second output switch to the non-conduction state, switch the first input switch and the first output switch to the conduction state, and read out and amplify a first reading signal by the first conversion gain mode reading (LCG).

4. The solid-state imaging device according to claim 3, wherein the amplifying part includes:
  a first auto-zero switch connected between the second node and the fifth node in parallel with the first feedback capacitor; and
  a second auto-zero switch connected between the third node and the sixth node in parallel with the second feedback capacitor, and
wherein the reading part is configured to:
  reset the floating diffusion through the reset element in the reset period and retain the first auto-zero switch in the conduction state for a predetermined period to initialize the amplifier;
  switch, after reading out the first reset signal, the first input switch and the first output switch to the non-conduction state and retain the second auto-zero switch in the conduction state for a predetermined period to initialize the amplifier; and
  switch, at least after initialization by the second auto-zero switch, the second input switch and the second output switch to the conduction state, and read out and amplify the second reset signal by the second conversion gain mode reading (HCG).

5. The solid-state imaging device according to claim 1, wherein the amplifier includes:
  a first drain node;
  a second drain node connected to the fourth node;
  a first PMOS transistor having a source connected to a power supply and having a gate and a drain connected to each other at a connection part that is connected to the first drain node;
  a second PMOS transistor having a source connected to the power supply, a gate connected to the gate and the drain of the first PMOS transistor, and a drain connected to the second drain node;
  a current source connected to a first reference potential;
  a two-channel non-inverting input terminal including a first non-inverting input channel and a second non-inverting input channel connected between the first drain node and the current source; and
  a two-channel inverting input terminal including a first inverting input channel and a second inverting input channel connected between the second drain node and the current source, wherein the first non-inverting input channel includes a first NMOS transistor and a first drain switch connected in series between the first drain node and the current source, wherein the second non-inverting input channel includes a second NMOS transistor and a second drain switch connected in series between the first drain node and the current source, wherein the first inverting input channel includes a third NMOS transistor and a third drain switch connected in series between the second drain node and the current source, wherein the second inverting input channel includes a fourth NMOS transistor and a fourth drain switch connected in series between the second drain node and the current source, wherein the first drain switch and the third drain switch are controlled into the conduction state or the non-conduction state in phase with the first input switch and the first output switch, wherein the second drain switch and the fourth drain switch are controlled into the conduction state or the non-conduction state in phase with the second input switch and the second output switch, wherein a gate of the first NMOS transistor and a gate of the second NMOS transistor are connected to the first reference potential, wherein a gate of the third NMOS transistor is connected to the second node, and wherein a gate of the fourth NMOS transistor is connected to the third node.

6. The solid-state imaging device according to claim 5, wherein the amplifier comprises a telescopic amplifier.

7. The solid-state imaging device according to claim 5, wherein the amplifier comprises a two-stage amplifier.

8. The solid-state imaging device according to claim 5, wherein the amplifier comprises a folded cascode amplifier.

9. The solid-state imaging device according to claim 1, wherein in the amplifier,
  the non-inverting input terminal includes two channels: a first non-inverting input channel and a second non-inverting input channel, and
  at least one of the two channels of the non-inverting input terminal is connected to a pixel ground noise cancelling circuit.

10. The solid-state imaging device according to claim 9, wherein the pixel ground noise cancelling circuit includes:
  a channel node connected to the non-inverting input terminal;
  a sampling capacitor connected between a signal input line and the channel node;
  a feedback capacitor connected between the channel node and a first reference potential; and
  a switch for selectively connecting between the channel node and a second reference potential.

11. The solid-state imaging device according to claim 10, wherein when each of the two channels of the non-inverting input terminal is connected to the respective pixel ground noise cancelling circuit,
  a capacitance of the sampling capacitor in the pixel ground noise cancelling circuit connected to one of the two channels is equal to a capacitance of the first sampling capacitor, and
  a capacitance of the sampling capacitor in the pixel ground noise cancelling circuit connected to the other of the two channels is equal to a capacitance of the second sampling capacitor.

12. The solid-state imaging device according to claim 1, wherein the amplifier includes:
    a first drain node;
    a second drain node connected to the fourth node;
    a first PMOS transistor having a source connected to a power supply and having a gate and a drain connected to each other at a connection part that is connected to the first drain node;
    a second PMOS transistor having a source connected to the power supply, a gate connected to the gate and the drain of the first PMOS transistor, and a drain connected to the second drain node;
    a current source connected to a first reference potential;
    a one-channel non-inverting input terminal including a first non-inverting input channel connected between the first drain node and the current source; and
    a two-channel inverting input terminal including a first inverting input channel and a second inverting input channel connected between the second drain node and the current source,
    wherein the first non-inverting input channel includes a first NMOS transistor connected in series between the first drain node and the current source,
    wherein the first inverting input channel includes a third NMOS transistor and a third drain switch connected in series between the second drain node and the current source,
    wherein the second inverting input channel includes a fourth NMOS transistor and a fourth drain switch connected in series between the second drain node and the current source,
    wherein the third drain switch is controlled into the conduction state or the non-conduction state in phase with the first input switch and the first output switch,
    wherein the fourth drain switch is controlled into the conduction state or the non-conduction state in phase with the second input switch and the second output switch,
    wherein the first NMOS transistor is connected to the first reference potential,
    wherein a gate of the third NMOS transistor is connected to the second node, and
    wherein a gate of the fourth NMOS transistor is connected to the third node.

13. The solid-state imaging device according to claim 12, wherein in the amplifier, the first non-inverting input channel of the non-inverting input terminal is connected to a pixel ground noise cancelling circuit.

14. The solid-state imaging device according to claim 13, wherein the pixel ground noise cancelling circuit includes:
    a channel node connected to the non-inverting input terminal;
    a sampling capacitor connected between a signal input line and the channel node;
    a feedback capacitor connected between the channel node and the first reference potential; and
    a switch for selectively connecting between the channel node and a second reference potential.

15. The solid-state imaging device according to claim 14, wherein a capacitance of the sampling capacitor in the pixel ground noise cancelling circuit is equal to a capacitance of the second sampling capacitor.

16. The solid-state imaging device according to claim 1, wherein in the amplifying part, the inverting input terminal of the amplifier has n (n is an integer equal to or greater than three) inverting input channels including an n-th inverting input channel, and
    wherein the amplifying part includes:
        a seventh node connected to the n-th inverting input channel;
        an eighth node connected to the fourth node via a third output switch;
        a third input switch and a third sampling capacitor connected in series between the first node and the seventh node; and
        a third feedback capacitor connected between the seventh node and the eighth node.

17. The solid-state imaging device according to claim 16, wherein the third sampling capacitor, the second sampling capacitor, and the first sampling capacitor have different capacitances.

18. The solid-state imaging device according to claim 16, wherein the amplifying part includes a third auto-zero switch connected between the seventh node and the eighth node in parallel with the third feedback capacitor.

19. A method of driving a solid-state imaging device providing an extended dynamic range by combining a plurality of read-out signals each formed of a signal at a reference level and a signal at a signal level, the solid-state imaging device including:
    a pixel part including a pixel arranged therein; and
    a reading part including a column signal processing part arranged so as to correspond to a column output of the pixel part,
    wherein the pixel includes:
        a photoelectric conversion element for storing therein, in a storage period, charges generated by photoelectric conversion;
        a transfer element for transferring, in a transfer period, the charges stored in the photoelectric conversion element;
        a floating diffusion to which the charges stored in the photoelectric conversion element are transferred through the transfer element;
        a source follower element for converting the charges in the floating diffusion into a voltage signal at a level corresponding to the quantity of the charges and outputting the voltage signal to an output node; and
        a reset element for resetting, in a reset period, the floating diffusion to a predetermined potential, and
    wherein the column signal processing part includes an amplifying part for amplifying the plurality of read-out signals read out from the pixel,
    wherein the amplifying part includes:
        an amplifier including an inverting input terminal and a non-inverting input terminal, the inverting input terminal having at least a first inverting input channel and a second inverting input channel;
        a first node to which the plurality of read-out signals are input;
        a second node connected to the first inverting input channel;
        a third node connected to the second inverting input channel;
        a fourth node connected to an output terminal of the amplifier;
        a fifth node connected to the fourth node via a first output switch;
        a sixth node connected to the fourth node via a second output switch;

a first input switch and a first sampling capacitor connected in series between the first node and the second node;

a second input switch and a second sampling capacitor connected in series between the first node and the third node;

a first feedback capacitor connected between the second node and the fifth node; and a second feedback capacitor connected between the third node and the sixth node, and wherein a capacitance of the second sampling capacitor is larger than that of the first sampling capacitor, the method comprising:

resetting the floating diffusion through the reset element in the reset period;

reading out and amplifying, at least in a first reading period after the reset period, a first reset signal by first conversion gain mode reading (LCG), while retaining the first input switch and the first output switch in a conduction state for a predetermined period;

switching, after reading out the first reset signal, the first input switch and the first output switch to a non-conduction state;

switching the second input switch and the second output switch to the conduction state, and reading out and amplifying a second reset signal by second conversion gain mode reading (HCG);

causing, in a transfer period after the first reading period, the charges stored in the photoelectric conversion element to be transferred to the floating diffusion through the transfer element;

reading out and amplifying, in a second reading period after the transfer period, a second read-out signal by the second conversion gain mode reading (HCG), while retaining the second input switch and the second output switch in the conduction state; and switching, after reading out the second read-out signal, the second input switch and the second output switch to the non-conduction state, switching the first input switch and the first output switch to the conduction state, and reading out and amplifying a first reading signal by the first conversion gain mode reading (LCG).

20. An electronic apparatus comprising:

a solid-state imaging device providing an extended dynamic range by combining a plurality of read-out signals each formed of a signal at a reference level and a signal at a signal level; and an optical system for forming a subject image on the solid-state imaging device, wherein the solid-state imaging device includes:

a pixel part including a pixel arranged therein; and a reading part including a column signal processing part arranged so as to correspond to a column output of the pixel part, wherein the column signal processing part includes an amplifying part for amplifying the plurality of read-out signals read out from the pixel, and wherein the amplifying part includes:

an amplifier including an inverting input terminal and a non-inverting input terminal, the inverting input terminal having at least a first inverting input channel and a second inverting input channel;

a first node to which the plurality of read-out signals are input;

a second node connected to the first inverting input channel;

a third node connected to the second inverting input channel;

a fourth node connected to an output terminal of the amplifier;

a fifth node connected to the fourth node via a first output switch;

a sixth node connected to the fourth node via a second output switch;

a first input switch and a first sampling capacitor connected in series between the first node and the second node;

a second input switch and a second sampling capacitor connected in series between the first node and the third node;

a first feedback capacitor connected between the second node and the fifth node; and a second feedback capacitor connected between the third node and the sixth node.

* * * * *